(12) United States Patent
Forrest et al.

(10) Patent No.: US 7,768,194 B2
(45) Date of Patent: *Aug. 3, 2010

(54) FLUORESCENT FILTERED ELECTROPHOSPHORESCENCE

(75) Inventors: Stephen Forrest, Ann Arbor, MI (US); Yiru Sun, Princeton, NJ (US); Noel Giebink, Ann Arbor, MI (US); Mark E. Thompson, Anaheim Hills, CA (US)

(73) Assignees: The Trustees of Princeton University, Princeton, NJ (US); The University of Southern California, Los Angeles, CA (US)

( * ) Notice: Subject to any disclaimer, the term of this patent is extended or adjusted under 35 U.S.C. 154(b) by 1036 days.

This patent is subject to a terminal disclaimer.

(21) Appl. No.: 11/446,022

(22) Filed: Jun. 1, 2006

(65) Prior Publication Data

US 2006/0279203 A1  Dec. 14, 2006

Related U.S. Application Data

(63) Continuation-in-part of application No. 11/143,319, filed on Jun. 1, 2005, now Pat. No. 7,474,048.

(60) Provisional application No. 60/738,252, filed on Nov. 18, 2005, provisional application No. 60/738,868, filed on Nov. 22, 2005, provisional application No. 60/781,676, filed on Mar. 13, 2006.

(51) Int. Cl.
*H05B 33/00* (2006.01)

(52) U.S. Cl. .................. 313/504; 313/506; 428/690

(58) Field of Classification Search ......... 313/504–506; 428/690; 445/23–25
See application file for complete search history.

(56) References Cited

U.S. PATENT DOCUMENTS

| | | | |
|---|---|---|---|
| 5,540,999 A | 7/1996 | Yamamoto et al. | |
| 5,756,224 A | 5/1998 | Borner et al. | |
| 5,837,391 A * | 11/1998 | Utsugi | .................. 428/690 |
| 6,580,213 B2 | 6/2003 | Yamazaki | |
| 6,635,364 B1 | 10/2003 | Igarashi | |
| 6,864,628 B2 | 3/2005 | Yamazaki et al. | |
| 6,872,472 B2 | 3/2005 | Liao et al. | |
| 6,885,025 B2 | 4/2005 | Tung et al. | |
| 6,885,149 B2 | 4/2005 | Parthasarathy et al. | |
| 7,276,842 B2 * | 10/2007 | Tsukamoto | ................. 313/309 |
| 2001/0053462 A1 | 12/2001 | Mishima | |
| 2002/0071963 A1 | 6/2002 | Fujii | |
| 2002/0197511 A1 | 12/2002 | D'Andrade et al. | |
| 2003/0001165 A1 | 1/2003 | Taki | |
| 2003/0068528 A1 * | 4/2003 | Thompson et al. | .......... 428/690 |
| 2003/0197467 A1 | 10/2003 | Adachi et al. | |
| 2004/0104394 A1 | 6/2004 | Ming-Der et al. | |
| 2004/0195965 A1 | 10/2004 | Yamazaki et al. | |

FOREIGN PATENT DOCUMENTS

JP  2002 063988  2/2002

OTHER PUBLICATIONS

PCT International Search Report and Written Opinion from PCT/US06/21801, mailed Sep. 11, 2007.

* cited by examiner

*Primary Examiner*—Joseph L Williams
(74) *Attorney, Agent, or Firm*—Kenyon & Kenyon LLP

(57) ABSTRACT

The present invention relates to organic light emitting devices (OLEDs), and more specifically to OLEDS that emit light using a combination of fluorescent emitters and phosphorescent emitters for the efficient utilization of all of the electrically generated excitons.

53 Claims, 28 Drawing Sheets

(A)

(B)

(A)

(B)

a.

b.

FLUORESCENT FILTERED ELECTROPHOSPHORESCENCE

RELATED APPLICATIONS

This application is a continuation-in-part of U.S. application Ser. No. 11/143,319, filed Jun. 1, 2005 now U.S. Pat. No. 7,474,048, and also claims the benefit of U.S. Provisional Patent Application No.: 60/738,252, filed Nov. 18, 2005; U.S. Provisional Patent Application No.: 60/738,868, filed Nov. 22, 2005; and U.S. Provisional Patent Application No.: 60/781,676, filed Mar. 13, 2006, which are incorporated herein by reference in their entirety.

GOVERNMENT RIGHTS

This invention was made with Government support under Contract No. DE-FC26-04NT42272 awarded by the Department of Energy. The government has certain rights in this invention.

RESEARCH AGREEMENTS

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to OLEDS that emit light using a combination of fluorescent emitters and phosphorescent emitters for the efficient utilization of all of the electrically generated excitons.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

The quality of white illumination sources can be fully described by a simple set of parameters. The color of the light source is given by its CIE chromaticity coordinates x and y (1931 2-degree standard observer CIE chromaticity). The CIE coordinates are typically represented on a two dimensional plot. Monochromatic colors fall on the perimeter of the horseshoe shaped curve starting with blue in the lower left, running through the colors of the spectrum in a clockwise direction to red in the lower right. The CIE coordinates of a light source of given energy and spectral shape will fall within the area of the curve. Summing light at all wavelengths uniformly gives the white or neutral point, found at the center of the diagram (CIE x,y-coordinates, 0.33, 0.33). Mixing light from two or more sources gives light whose color is represented by the intensity weighted average of the CIE coordinates of the independent sources. Thus, mixing light from two or more sources can be used to generate white light.

When considering the use of these white light sources for illumination, the CIE color rendering index (CRI) may be considered in addition to the CIE coordinates of the source. The CRI gives an indication of how well the light source will render colors of objects it illuminates. A perfect match of a given source to the standard illuminant gives a CRI of 100. Though a CRI value of at least 70 may be acceptable for certain applications, a preferred white light source may have a CRI of about 80 or higher.

White OLEDs having only phosphorescent emissive materials may be highly efficient, but their operation stability is currently limited by the lifetime of the blue phosphorescent component. White OLEDs having all fluorescent emissive materials may have good operational stability, but their external quantum efficiency is generally about three times lower than that of all-phosphorescent white OLEDs. The present invention combines phosphorescent and fluorescent technologies in an improved device structure to achieve an improved balance of efficiency and lifetime in a white OLED.

SUMMARY OF THE INVENTION

The present invention provides organic light emitting devices having a combined emission from at least two emissive materials, a fluorescent emissive material and a phosphorescent emissive material, in order to directly utilize all of the electrically generated excitons. The devices of the present invention utilize high efficiency fluorescent emitters for harvesting the singlet fraction of the generated excitons and high efficiency phosphorescent emitters for the triplet fraction of the generated excitons. Thus, the present invention is directed toward efficient utilization of all of the electrically generated excitons (potentially giving 100% internal efficiency).

The present invention also provides an organic light emitting device comprising a cathode, an emissive region, and an anode, wherein, the emissive region comprises a fluorescent layer comprising a fluorescent emitting material as a dopant in a host material, and a phosphorescent layer comprising a phosphorescent emitting material as a dopant in a host material, and wherein greater than about 50% of the excitons are generated in the fluorescent layer.

The present invention also provides an organic light emitting device comprising a cathode, an emissive region, and an anode, wherein the emissive region comprises the following layers in sequence: a fluorescent layer comprising a fluorescent emitting material as a dopant in a host material, a spacer layer, a phosphorescent layer comprising a phosphorescent emitting material as a dopant in a host material, a spacer layer, and a fluorescent layer comprising a fluorescent emitting material as a dopant in a host material.

The present invention also provides an organic light emitting device comprising a cathode, an emissive region and an anode, wherein the emissive region comprises the following layers in sequence: a fluorescent layer comprising a fluorescent emitting material as a dopant in a host material, an optional spacer layer, and a phosphorescent layer comprising a phosphorescent emitting material as a dopant in a host material. By varying, or in some cases eliminating, the spacer layer between the fluorescent-doped layer, which is blue emitting, and the phosphorescent-doped layer or layers, which are red- and green-emitting layers, the fraction of excitons that diffuse from the fluorescent layer into the phosphorescent layer or layers versus the excitons that are formed directly on the phosphorescent emitter, can be precisely varied, such as exemplified in Examples 4-8. This control over exciton formation has two important effects: (1) it can provide precise control of the color balance and efficiency of the white light source, and (2) it reduces triplet-triplet annihilation at high brightness, since the excitons formed by direct trapping do not exist at such high densities in the fluorescent exciton formation zone. In particular, the results and modeling that are presented in Examples 4-8 show that having only one spacer layer can improve performance, such as increasing the CRI, simply by virtue of increased charge trapping. It is believed that this charge trapping can be important for achieving optimized white light balanced and efficiency for example, in high intensity sources used in solid-state lighting (SSL). Such charge trapping was calculated to be between about 25-35%, which is surprisingly close to theoretical predictions.

The present invention provides a method for the color tuning of an organic light emitting device, wherein the device comprises a cathode, an emissive region, and an anode, and wherein the emissive region comprises a fluorescent layer comprising a fluorescent emitting material as a dopant in a host material, and a phosphorescent layer comprising a phosphorescent emitting material as a dopant in a host material. The method has the steps of: providing the fluorescent emitting material in a concentration that traps a fraction of charge carriers such that a fraction of excitons formed in the device are singlet excitons formed by direct trapping on the fluorescent emitting material; and providing the phosphorescent emitting material in a concentration that traps a fraction of charge carriers such that a fraction of excitons formed in the device are triplet excitons formed by direct trapping on the phosphorescent emitting material; wherein the concentration of the fluorescent and phosphorescent emitting materials are provided to give a desired color emission when a voltage is applied across the device.

DETAILED DESCRIPTION

Figure 1:
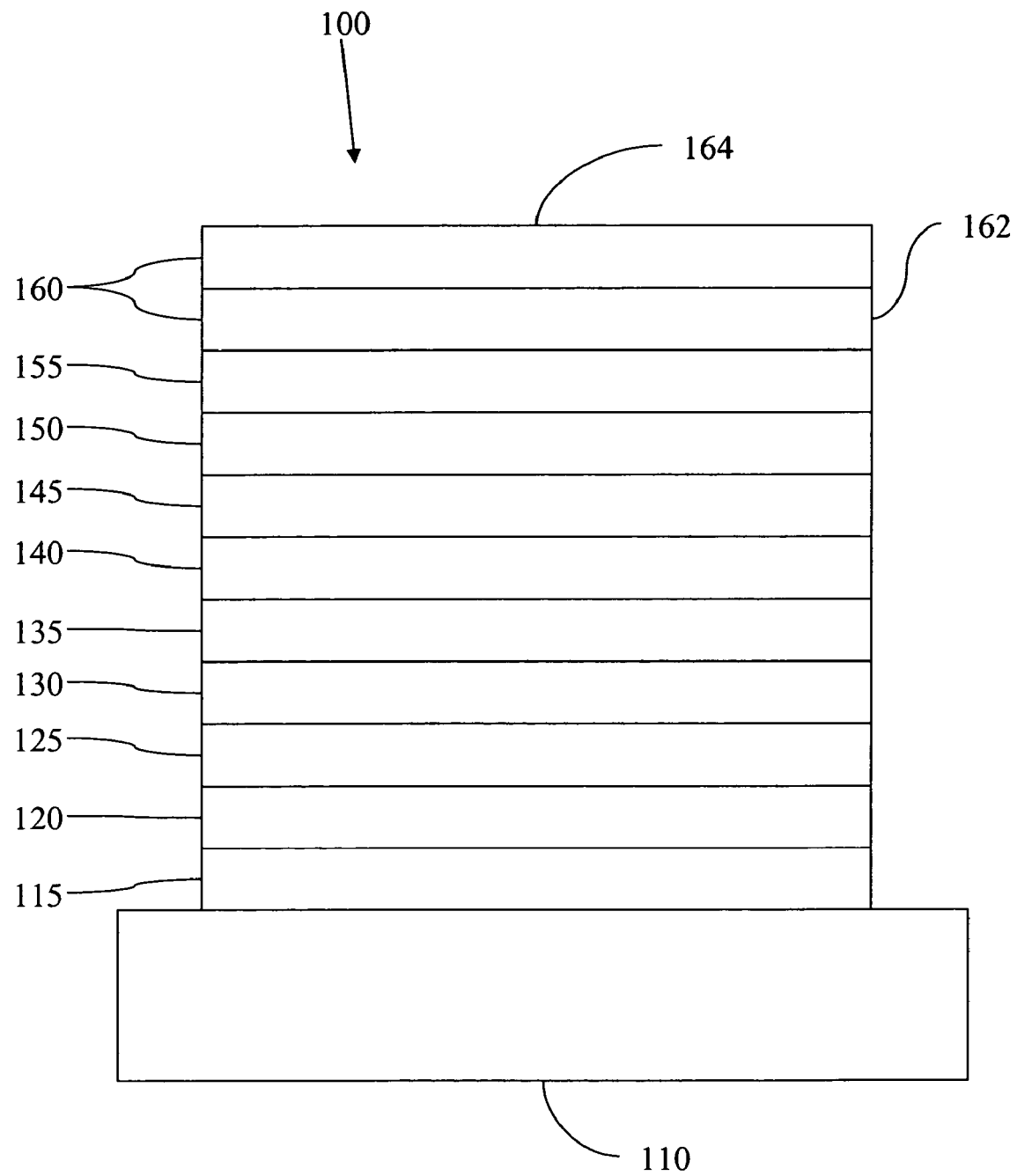
FIG. 1 shows an organic light emitting device having separate electron transport, hole transport, and emissive layers, as well as other layers.

Fluorescent organic light-emitting devices have an upper limit of approximately 25% for internal quantum efficiency (IQE), due to the requirement of spin-symmetry conservation. The alternative radiative process of phosphorescence has shown very high, even nearly 100% IQE. However, blue phosphorescent dopants with long lifetimes have not been achieved yet, which limits the device lifetime and thus the application potential of the three-color white OLED (WOLED) using red, green and blue phosphorescent dopants. Furthermore, in devices having only phosphorescent emitting materials, the exchange interaction energy is effectively lost, since phosphorescent materials emit light from spin-symmetric excitons (triplets) whose energy level is ~0.8 eV lower than spin-antisymmetric excitons (singlets) in organic system. In the present invention, these deficiencies are overcome by using a fluorescent dopant to harness higher-energy singlet excitons for blue emission and phosphorescent dopants to harness lower-energy triplet excitons for green and red emission. For the devices of the invention, the IQE can be as high as 100%. In preferred embodiments, the devices of the present invention have peak power efficiencies of at least about (18.7±0.5)% and (37.6±0.6)lm/W, challenging incandescent light sources.

Thus, the present invention is directed toward efficient utilization of all of the electrically generated excitons (potentially giving 100% internal efficiency). The approach described herein uses a combination of fluorescent and phosphorescent emitting materials in order to directly utilize all of the electrically generated excitons. A phosphorescent emitting material is used for the efficient harvesting and emission from triplet excitons, while the singlet excitons formed by hole-electron recombination are trapped at a fluorescent emitting material directly and not transferred to the phosphorescent emitting material. Thus, the devices of the invention will emit independently and simultaneously from singlet and triplet emissive centers, the fluorescent emitting material and the phosphorescent emitting material, respectively. Since the fluorescent emitting material can have near unit luminance efficiencies for singlet excitons and phosphorescent emitting material have similar efficiencies for triplet excitons, this approach has the potential to achieve 100% EL efficiency. This approach is clearly distinct form previous approaches. Here the 25% singlets are trapped and emit from a fluorescent dopant and the 75% triplets that are formed are trapped and emit at the phosphorescent dopant. In previous devices the intention has been to trap both singlet and triplet excitons at the phosphorescent dopant, followed by emission or transfer to another dopant.

A key advantage of the present invention over the previous applications of electrophosphorescence is that separate colors can be emitted from the fluorescent and phosphorescent centers. For example, it a device according to an embodiment of the present invention may be constructed to have blue emission from a fluorescent dopant and green emission from the phosphorescent dopant. The result would be an OLED with an emission spectrum that was the sum of the blue and green emission spectra. Alternatively, a device according to another embodiment of the present invention may be used to prepare a white emissive OLED, in which the blue component of the spectrum is from the fluorescent dopant and the green-to-red (G-R) components of the white light are provided by the phosphorescent dopant(s). The G-R phosphor could be a single dopant that emits with a broad emission spectrum or two dopants, chosen such that the sum of their spectra cover the range from green to red. In this way, 25% of the excitons would produce blue light, while the remaining 75% are used for the G-R part of the emission spectrum. This is roughly the ratio of blue to G-R in the typical white OLED spectrum. This approach to a white OLED may have the benefit of a stable color balance as the drive voltage is increased and an enhanced stability. The enhanced stability results from having long lived fluorescent blue components coupled to long lived G-R phosphors in a single device.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 milliseconds, and typically greater than 100 milliseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-Bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 15 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-02309890 to Forrest et al., which is incorporated by reference in its entirety. Other hole transport layers may be used.

The emissive region 135 is comprised of at least two emissive layers, each of which includes an organic material capable of emitting light when a current is passed between anode 115 and cathode 160. At least one of the emissive materials should be a phosphorescent emissive material, and at least on of the emissive materials should be a fluorescent emissive material. The emissive layers may also comprise a host material capable of transporting electrons and/or holes, doped with an emissive material that may trap electrons, holes, and/or excitons, such that excitons relax from the emissive material via a photoemissive mechanism. An emissive layer may comprise a single material that combines transport and emissive properties. Whether the emissive material is a dopant or a major constituent, the emissive layer may comprise other materials, such as dopants that tune the emission of the emissive material. Emissive region 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive region 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
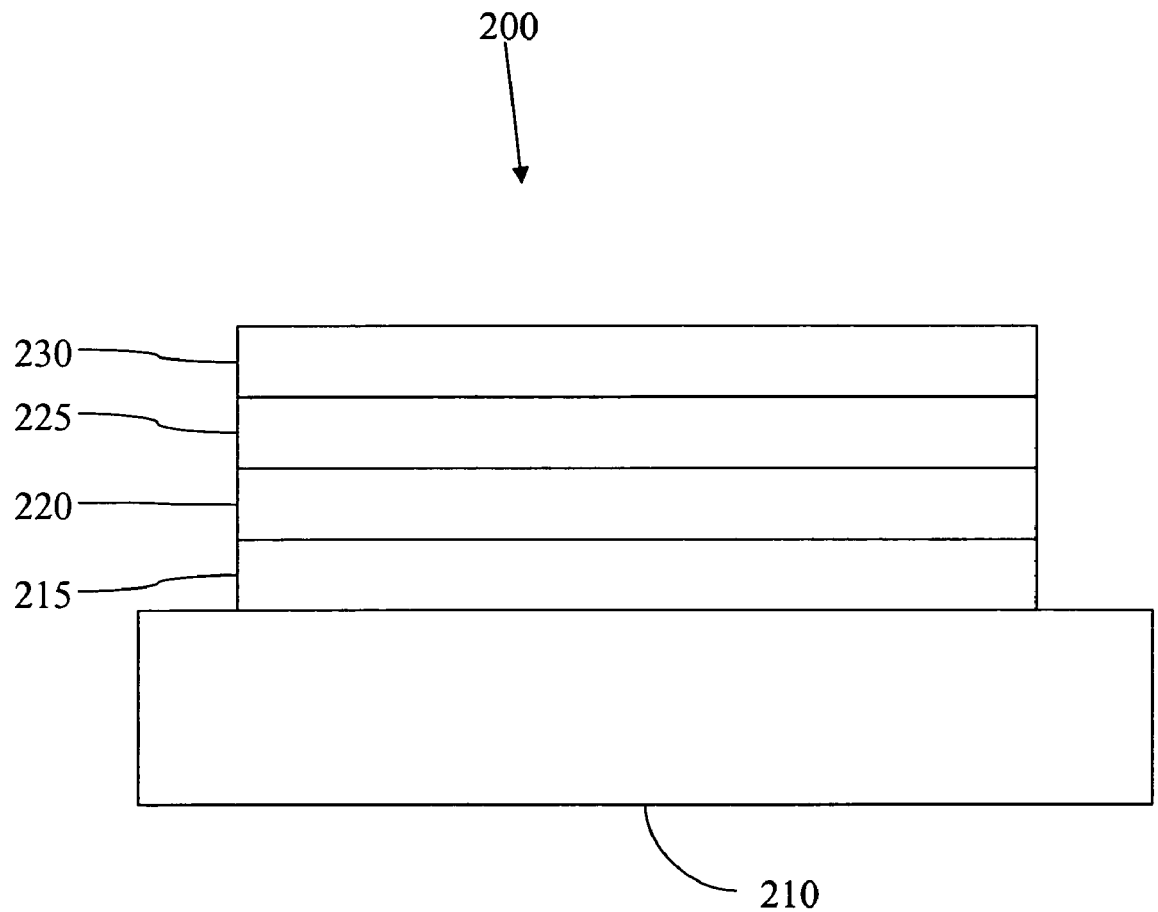
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C, and more preferably at room temperature (20-25 degrees C).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The devices of the present invention utilize high efficiency fluorescent emitters for harvesting the singlet fraction of the generated excitons and high efficiency phosphorescent emitters for the triplet fraction of the generated excitons. For a white device, the devices of the invention utilize a blue fluorescent material in combination with a green and red phosphorescent emitting material to yield high power efficiency, stable color balance and the potential for 100% internal quantum efficiency. Two distinct modes of energy transfer channel nearly all of the triplet energy to the phosphorescent emitting material(s), while retaining the singlet energy exclusively on the fluorescent emissive material. Additionally, eliminating the exchange energy loss from the singlet excitons allows for up to about 20% increased power efficiency compared to a phosphorescent-only device. This device architecture is distinctive in that the singlet and triplet excitons are harvested along independent channels, and thus the transfer from host to dopant for both species can be separately optimized to be nearly resonant, thereby minimizing energy losses while maintaining a unity IQE.

The invention provides efficient white-emitting or multi-colored emitting OLEDs. For white emitting devices, the combined emission of the emitting materials gives a white emission from the device. For preferred white-emitting devices, the two or more emissive dopants are selected so that the combined emission from the device has a CIE range between X=0.37±0.07 and Y=0.37±0.07. More preferably, the CIE coordinates are X=0.35±0.05, and Y=0.35±0.05 and even more preferably X=0.33±0.02, Y=0.33±0.02. The term "multicolored" refers to the emission from a device that results from two or more different emitting materials that each have different emissive spectra. Although a high CRI value may be preferred for certain lighting applications, the devices of the present invention may be used to produce a light source that provides other colors as well. In preferred embodiments, the devices of the present invention are capable of achieving an external quantum efficiency of at least about 6%.

For white-emitting devices for illumination, the color rendering index (CRI) may be an important consideration, as the CRI gives an indication of how well the light source will render the colors of objects it illuminates. For preferred white-emitting devices of the invention, the CRI value is at least about 75, more preferably at least about 80, and most preferably at least about 85.

The emissive region may be comprised of a single layer containing the fluorescent emitting material and the phosphorescent emitting material or, in preferred embodiments, multiple layers such that the fluorescent emitting material(s) and the phosphorescent emitting material(s) are doped into different layers within the emissive region. In one embodiment of the invention the fluorescent emitting material(s) and the phosphorescent emitting material(s) are mixed in the same emissive layer. In this case the doping levels will be such that the fluorescent emitting material(s) and the phosphorescent emitting material(s) do not interact directly, but receive charge or exciton energy only from the host matrix. Recombination will either occur in the host matrix or on the fluorescent dopant. In either case the fluorescent exciton will be trapped and emit from the fluorescent dopant. The triplet exciton will then diffuse through the host matrix to the phosphorescent dopant(s), where it will be trapped and emit.

Figure 3:
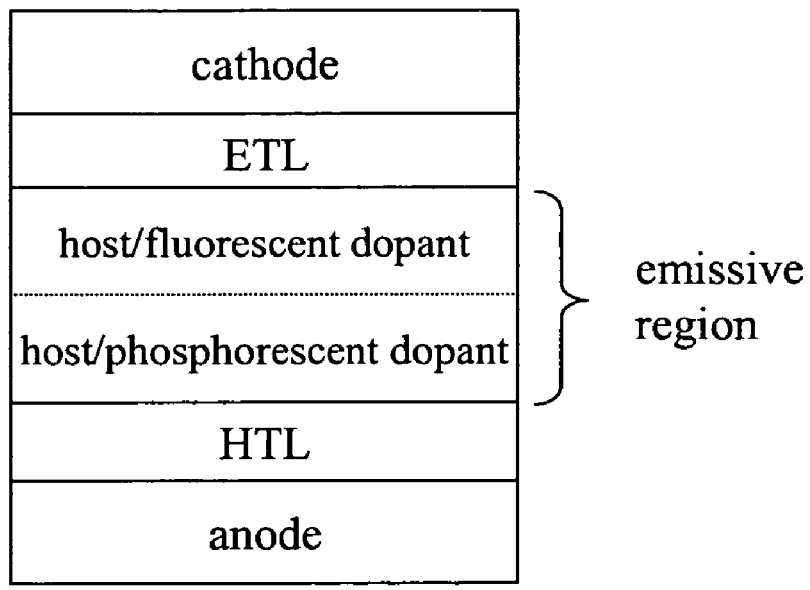
FIG. 3 show schematic device structures for embodiments of the invention.
Figure 3:
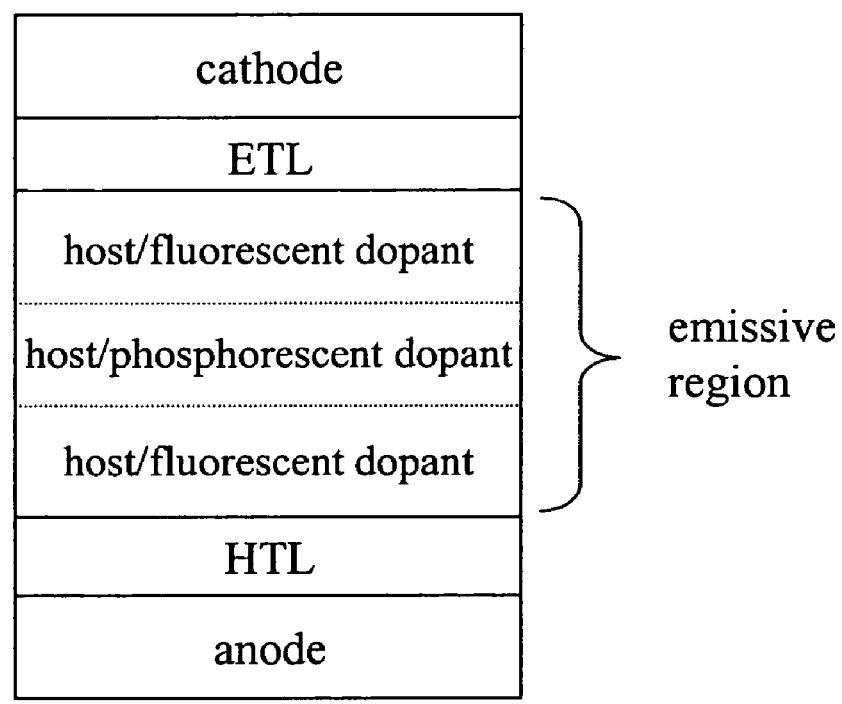

In preferred embodiments of the invention, the emissive region comprises two or more layers such that the fluorescent emitting material(s) and the phosphorescent emitting material(s) are doped into different layers within the emissive region. In one embodiment of the invention, the emissive region comprises two adjacent emissive layers, a fluorescent emissive layer and a phosphorescent emissive layer. A representative structure of a device according to this embodiment is depicted in FIG. 3A. The fluorescent layer comprises a material that emits via a fluorescent mechanism (i.e., by the decay of a singlet exciton). In preferred embodiments, the fluorescent layer further comprises a host material into which the fluorescent emitting material is doped. The phosphorescent layer comprises one or more phosphorescent emitting materials which are present as dopants in a host material. The phosphorescent materials may be present in the same layer or in separate layers within the emissive region (see, for example, FIG. 5).

In another in a preferred embodiment, the emissive region comprises a phosphorescent layer or layers sandwiched between two fluorescent layers. Representative device structures according to this embodiment are depicted in FIGS. 3B, 4B, 5C and 5D. The two fluorescent layers may comprise the same fluorescent emissive material or different fluorescent emissive materials, although in preferred embodiments, the same fluorescent emissive material will be doped into both fluorescent layers. The phosphorescent layer comprises one or more phosphorescent emitting materials which are present as dopants in a host material. When two phosphorescent emitting materials are used (for example, a green-emitting phosphorescent material and a red-emitting phosphorescent material) the two phosphorescent materials may be co-doped into the same layer. Alternatively, the two phosphorescent materials may be doped into separate phosphorescent layers (for example, a separate green phosphorescent layer and a red phosphorescent layer).

In preferred embodiments of the invention, the fluorescent layer is separated from the phosphorescent layer by a spacer layer. Representative structures of devices according to this embodiment are depicted in FIGS. 4A, 4B, 5B, 5C and 5D. Direct energy transfer across the fluorescent/phosphorescent doped interface can act to inhibit all excitons from emitting from the lower energy phosphors than in the fluorescent layer. A spacer may help to inhibit direct exciton migration, or even a higher energy host will provide an energy barrier to help with this inhibition but will not be so thick as to eliminate Dexter (tunneling) transfer. The spacer layer serves as a buffer, preventing direct transfer of singlets to the adjacent phosphorescent layer. Since singlet lifetime is very short, putting a spacer between fluorescent-doped layer and phosphorescent-doped layers can insure the majority of singlets are localized on fluorescent dopant molecules without easily transferring onto the phosphorescent dopant singlet states followed by effectively inter-system crossing to their triplets. The spacer layer is preferably thick enough to prevent singlet transfer via Förster mechanisms, i.e., the spacer has a thickness larger than the Förster radius (~30 Å). The spacer layer is preferably thin enough to allow the triplet excitons to reach the phosphorescent layer. In preferred embodiments the spacer layer is between about 30 Å to 200 Å and in particularly preferred embodiments the spacer layer is between about 40 Å to 150 Å thick. The spacer layer is preferably comprised of the same material as the host for the fluorescent and/or phosphorescent layer.

In preferred embodiments of the invention the host material for the fluorescent layer and phosphorescent layer are the same material. In the embodiments of the invention having a spacer layer separating the fluorescent layer and phosphorescent layer, the spacer layer is also preferably composed of the host material. This allows for optimal performance and the elimination of energy barriers to transport.

In preferred embodiments of the invention, the emissive region of the device is composed of layers such that the emissive region has the following structure:

fluorescent layer/phosphorescent layer;

fluorescent layer/spacer/phosphorescent layer;

fluorescent layer/spacer/phosphorescent layer/phosphorescent layer;

fluorescent layer/spacer/phosphorescent layer/fluorescent layer;

fluorescent layer/phosphorescent layer/spacer/fluorescent layer;

fluorescent layer/spacer/phosphorescent layer/phosphorescent layer/fluorescent layer;

fluorescent layer/phosphorescent layer/phosphorescent layer/spacer/fluorescent layer;

fluorescent layer/spacer/phosphorescent layer/spacer/fluorescent layer; and fluorescent layer/spacer/phosphorescent layer/phosphorescent layer/spacer/fluorescent layer.

For each configuration of the emissive region, it is preferred that layers directly adjacent to the emissive region block excitons and the opposite charge that they conduct.

The devices of the invention are constructed so that recombination occurs primarily in the fluorescent layer or layers. Even more preferably, the device is constructed so that the recombination zone is at the interface of a fluorescent layer and an adjacent transport layer (HTL or ETL) or blocking layer. The singlet excitons that are generated by the recombination of a hole and an electron are trapped by and emit from the fluorescent emissive material. The thickness of a fluorescent layer and the concentration of a fluorescent emitting material in the layer are adjusted so that the singlet excitons are completely trapped at the fluorescent emitting material. The triplet of the fluorescent dopant should be of sufficiently high energy that the triplet excitons are not trapped at the fluorescent dopant. Thus, in a preferred embodiment of the invention greater than about 50% of the recombination occurs within the fluorescent layer or layers, and in particularly preferred embodiments, greater than 70% of the recombination occurs within the fluorescent layer or layers.

The zone of recombination can be adjusted in a multilayer device by adjusting the materials used in one or more of the layers (for example the host material, HTL, ETL, and/or blocking layer) and by adjusting the thicknesses of the various layers. Further, recombination can be localized at the interface between layers made of dissimilar materials. Thus, recombination can be localized by the interface between the emissive region and an adjacent layer or layers, for example the HTL, ETL, blocking layer, etc.

The triplet excitons that are generated upon recombination diffuse from the recombination zone in the fluorescent layer into the phosphorescent emissive layer. The triplet energy of the fluorescent dopant should be of sufficiently high energy that the triplet excitons are not trapped at the fluorescent dopant. The triplet excitons will diffuse into the phosphor doped regions and be trapped. With the appropriate choice of materials, each dopant will emit with high efficiency and a high overall efficiency will be achieved for the device.

In a preferred embodiment of the invention, the fluorescent emissive material is a blue-emitting fluorescent material. To date, phosphorescent blue emitters have generally displayed poor operational stability in OLEDs. Fluorescent blue emitters are selected to be highly efficient and to have good operational lifetimes in OLEDs. For white-emitting devices, green-to-red (G-R) components of the white light are provided by one or more phosphorescent emitting materials. The phosphorescent G-R emitting material could be a single dopant that emits with a broad emission spectrum or two dopants, chosen such that the sum of their spectra cover the range from green to red. In this way, 25% of the excitons would produce blue light from the fluorescent blue emitting material, while the remaining 75% of the excitons are used for the G-R part of the emission spectrum. This is roughly the ratio of blue to G-R in the typical white OLED spectrum. This approach to a white OLED may provide a stable color balance as the drive voltage is increased and an enhanced device stability. The enhanced stability results from having long lived fluorescent blue emitting materials used in conjunction with long lived G-R emitting phosphorescent emitting materials in a single device.

Preferred fluorescent blue emitters include polyaromatic compounds such as 9,10-di(2-naphthylantracene), perylenes, phenylenes, and fluorenes, with 4,4'-(Bis(9-ethyl-3-carbazovinylene)-1,1'-biphenyl being a particularly preferred fluorescent blue emitter. Preferred fluorescent blue emitters may be found in C. H. Chen, J. Shi, and C. W. Tang, "Recent Developments in Molecular Organic Electroluminescent Materials," Macromol. Symp. 125, pp. 1-48 (1997) and the references cited therein; L. S. Hung and C. H. Chen, "Recent progress of molecular organic electroluminescent materials and devices," Mat. Sci and Eng. R, 39 (2002), pp. 143-222 and the references cited therein, each of which is incorporated herein by reference in their entirety. Other preferred fluorescent blue emitters include arylpyrenes as described in the co-pending application entitled "Arylpyrene Compounds," Serial No. 11/097352, filed Apr. 4, 2005, which is incorporated herein by reference in its entirety. Other preferred blue fluorescent emitters include arylenevinylene compounds as described in U.S. Pat. Nos. 5,121,029 and 5,130,603, which are incorporated herein by reference in their entirety. The fluorescent blue emitting material is preferably doped into a host material at a concentration of about 1% to about 5%. The fluorescent layer preferably has a thickness of between about 50 Å to about 200 Å.

Preferred phosphorescent green emitters may be found in Baldo, M. A., Thompson, M. E. & Forrest, S. R. High efficiency fluorescent organic light-emitting devices using a phosphorescent sensitizer, Nature 403, 750-753 (2000); and in U.S. Pat. No. 6,830,828, each of which is incorporated herein by reference in their entirety. Preferred phosphorescent red emitters are derivatives of 2-phenylpyridine-iridium complexes, such as PQIr. Preferred phosphorescent red emitters may be found in U.S. Pat. Nos. 6,835,469 and 6,830,828, each of which is incorporated herein by reference in their entirety. The phosphorescent green emitting material is preferably doped into a host material at a concentration of about 2% to about 20%. The phosphorescent red emitting material is preferably doped into a host material at a concentration of about 2% to about 10%.

In an alternative embodiment of the invention, The green and red emission for the white device is provided by a single phosphorescent material that emits with a broad emission spectrum. Preferred dopants of this type include square planar organometallic platinum compounds, and may be found in U.S. Pat. Nos. 6,869,695 and 6,863,997, each of which is incorporated herein by reference in their entirety. The phosphorescent R-G emitting material is preferably doped into a host material at a concentration of about 5% to about 20%.

Similar materials will be used in the single-layer device, but to ensure adequate blue emission, the concentration of the blue fluorescent material may need to be increased to >5% and the green and red phosphors maintained at low levels, e.g. about 0.5% green and about 2% red.

Figure 26:
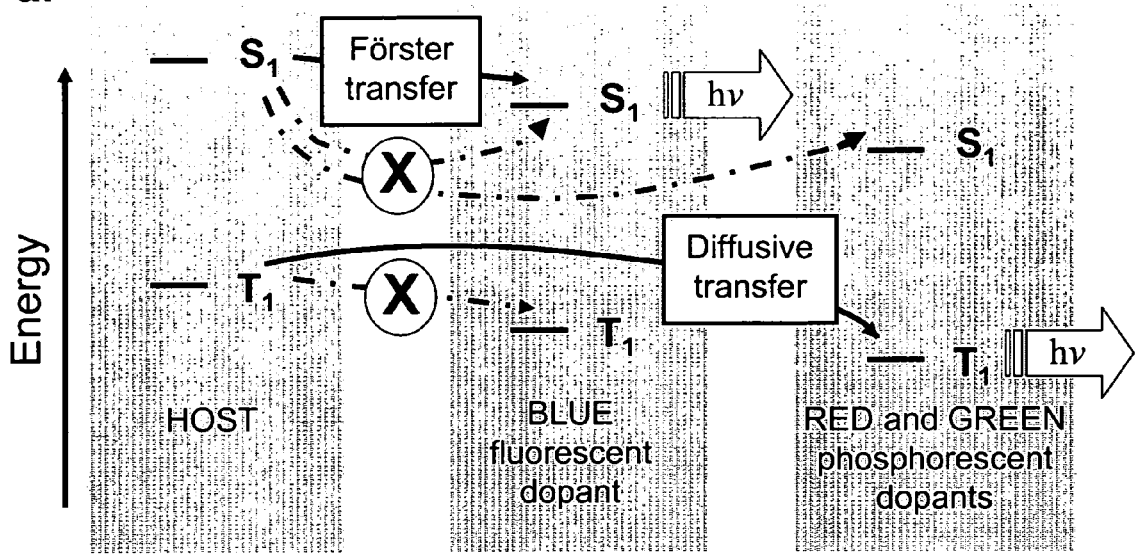
FIG. 26 shows the energy transfer routes available to singlet and triplet excitons (a) for the device of Example 8. 'X' denotes an energy transfer route that is unlikely to occur due to the spatial separation of the fluorescent and phosphorescent dopants. Exciton density within the emission layer (b) of the device of Example 8 (dashed line).
Figure 26:
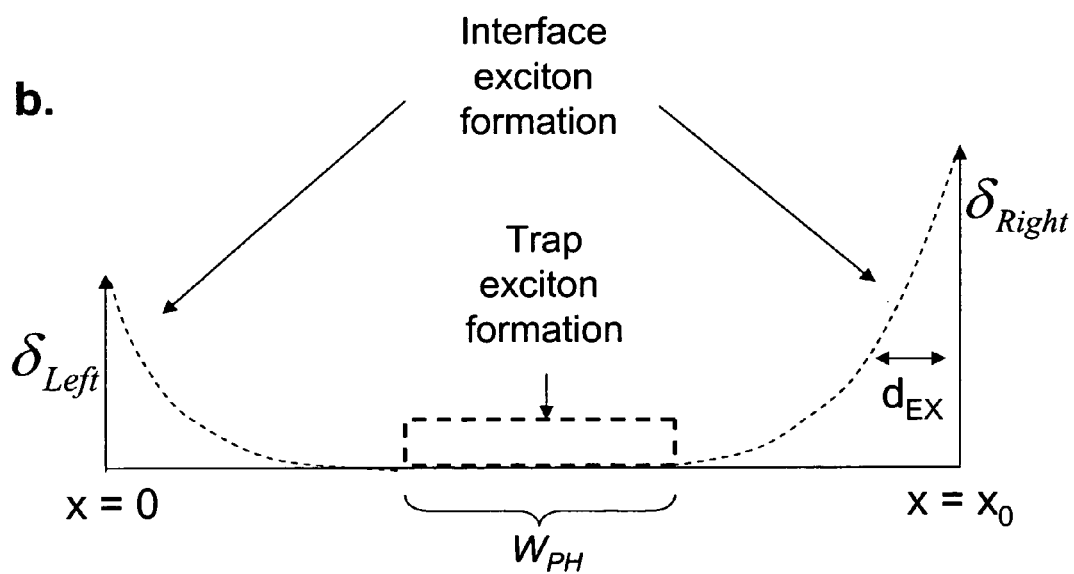

Without being limited by theory, the principle of the device operation is illustrated in FIG. 26 for preferred embodiments of the invention. Excitons are formed on the host with a singlet-to-triplet formation ratio of $\chi_s/\chi_t$. Singlet excitons are transferred following a resonant Förster process onto the lightly doped (5%) blue fluorescent emitter as opposed to direct trap formation. The non-radiative host triplets, however, cannot efficiently transfer to the fluorescent emitter by the Förster mechanism, nor by Dexter transfer due to the low doping concentration. On the other hand, triplets typically have long diffusion lengths (for example, about 100 nm), and hence can migrate into the center of the emissive region where they transfer onto the phosphorescent emissive material. Resonant transfer of the host triplet onto the green phosphorescent dopant avoids exchange energy losses at this stage, although there may be some unavoidable losses in transferring into the lowest energy red phosphorescent dopant. Placing an undoped host spacer with a thickness larger than the Förster radius between the blue fluorescent emitter and the phosphorescent emitter(s) prevents direct energy transfer from the blue fluorescent emitter to the green/red phosphorescent emitter(s). Using this device architecture, the singlet and triplet excitons are harvested along independent channels, thus the transfer from the host to the dopant for both species can be separately optimized to be nearly resonant, thereby minimizing energy losses while maintaining a unity IQE.

In another embodiment, the invention is directed to a method of tuning the emission from a device that contains multiple emissive dopants. The method uses the relative energetics of the dopant and the host charge transport levels as a factor in determining the emission strength of that dopant. Using different dopants with different energetics than the host allows tuning of the OLED emission spectrum, in conjunction with the dopant's concentration and the spacing of the emissive layers. The emission is tuned through the selection of dopants based on the extent that the dopant will trap charge when doped in a given host. Charge trapping and direct exciton formation on the dopant allows the position of the exciton formation zone(s) to be modified and the emission color tuned. The use of charge-trapping to tune the emission color may be dependent on doping concentration as well as the position of the doped layers in the device. Thus, color tuning may be achieved by controlling the fraction of charge that is trapped on the fluorescent dopants, phosphorescent dopants, or both, with the rest of the energy being transferred from host to dopant via Dexter and/or Forster mechanisms. The relative degree of charge trapping and transfer may be controlled through a number of factors, primarily the dopant/host combination, spacer layer thickness, and dopant layer thicknesses, and dopant concentrations to control the relative degree of trapping and transfer. For example, in certain devices of the present invention about 23% to about 33% of the excitons formed when a voltage is applied across the device are formed by direct trapping on the phosphorescent dopant.

Generally, the emissive dopant will trap holes when it has a HOMO level that is sufficiently higher than the HOMO level of the host material, and will trap electrons when it has a LUMO that is sufficiently lower than the LUMO of the host material. At the typical operating temperatures of the OLEDs of the invention (about 100° C.) an energy difference between the relevant energy level on the host and on the dopant of about 5 kT is considered to be sufficient to allow charge trapping. Based on this, for the trapping of a charge carrier, the energy difference between the relevant energy level on the host and on the dopant is preferably at least 0.1 eV, more preferably at least 0.2 eV, and even more preferably at least 0.3 eV. The amount of charge trapping that occurs on the dopant can be adjusted by selected the host and/or dopant having a different energy difference between the relevant energy level on the host and on the dopant.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting. Further, a number of experimental examples were fabricated to demonstrate that a desired CRI and/or CIE can be obtained by color tuning. It was demonstrated that the desired color could be obtained across a commercially useful range of current densities. One of skill in the art would understand how to adjust other parameters, such as drive voltage, while maintaining a desired current density.

Material Definitions:

As used herein, abbreviations refer to materials as follows:
CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(Ppy)_3$: tris(2-phenylpyridine)-iridium (also Irppy)
$Ir(ppz)_3$: tris(1-phenylpyrazoloto,N,C(2')iridium(III)
BCP: 2,9-dimethyl-4,7-diphenyl- 1,10-phenanthroline
TAZ: 3-phenyl-4-(1'-naphthyl)-5-phenyl-1,2,4-triazole
CuPc: copper phthalocyanine.
ITO: indium tin oxide
NPD: 4,4'-bis[N-(1-naphthyl)-N-phenyl-amino] -biphenyl
TPD: N,N'-diphenyl-N-N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylene-dioxythiophene) with polystyrenesulfonate (PSS)
BCzVBi 4,4'-(Bis(9-ethyl-3-carbazovinylene)-1,1'-biphenyl
PQIr iridium(III) bis(2-phenyl quinolyl-N,C2') acetylacetonate
UGH2 p-bis(triphenylsilyly)benzene

EXPERIMENTAL

Specific representative embodiments of the invention will now be described, including how such embodiments may be made. It is understood that the specific methods, materials, conditions, process parameters, apparatus and the like do not necessarily limit the scope of the invention.

Organic layers were deposited under $10^{-6}$ Torr vacuum chamber by thermal evaporation. The anode electrode was ~1200 Å of indium tin oxide (ITO). A 1 mm diameter shadow mask used to define LiF/Al cathode size. The cathode consisted of 10 Å of LiF followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. The devices were tested under ambient conditions, in the dark, using a Hewlett-Packard 4156C semiconductor parameter analyzer and a Newport Model 2932-C dual-channel power meter.

Example 1

A device was prepared having the device structure:

ITO/NPD 300 Å/CBP:BCzVBi 5% 90 Å /CBP 40 Å/CBP: PQIr 3% 150 Å / CBP:Irppy 3% 50 Å/CBP 40 Å/CBP:BCzVBi 5%110 Å/BCP 320 Å /LiF 8 Å/Al 500 Å.

The principles discussed herein were used to make a WOLED with a maximum external quantum efficiency ($\eta_{ext}$) of 9.2% at 1.8 mA/cm$^2$, which is comparable to or higher than reported WOLEDs using all phosphorescent dopants. The excitation voltage of the whole device may be approximately 20% less than the corresponding WOLEDs using a blue phosphorescent dopant and thus the peak total power efficiency is improved to 19.2 lm/W. Blue emission versus green-and-red emission is in the ratio close to the ideal ratio of singlet (25%) to triplet (75%). The resulting highly balanced white light gives a color rendering index of 85. By making the phosphorescent doping layers away from the exciton generation region which has highly concentrated local triplet density, the triplet-triplet annihilation is reduced and therefore $\eta_{ext}$ is high (>6.5%) over very wide range of current density ($10^{-2}$~$10^2$ mA/cm$^2$).

Figure 6:
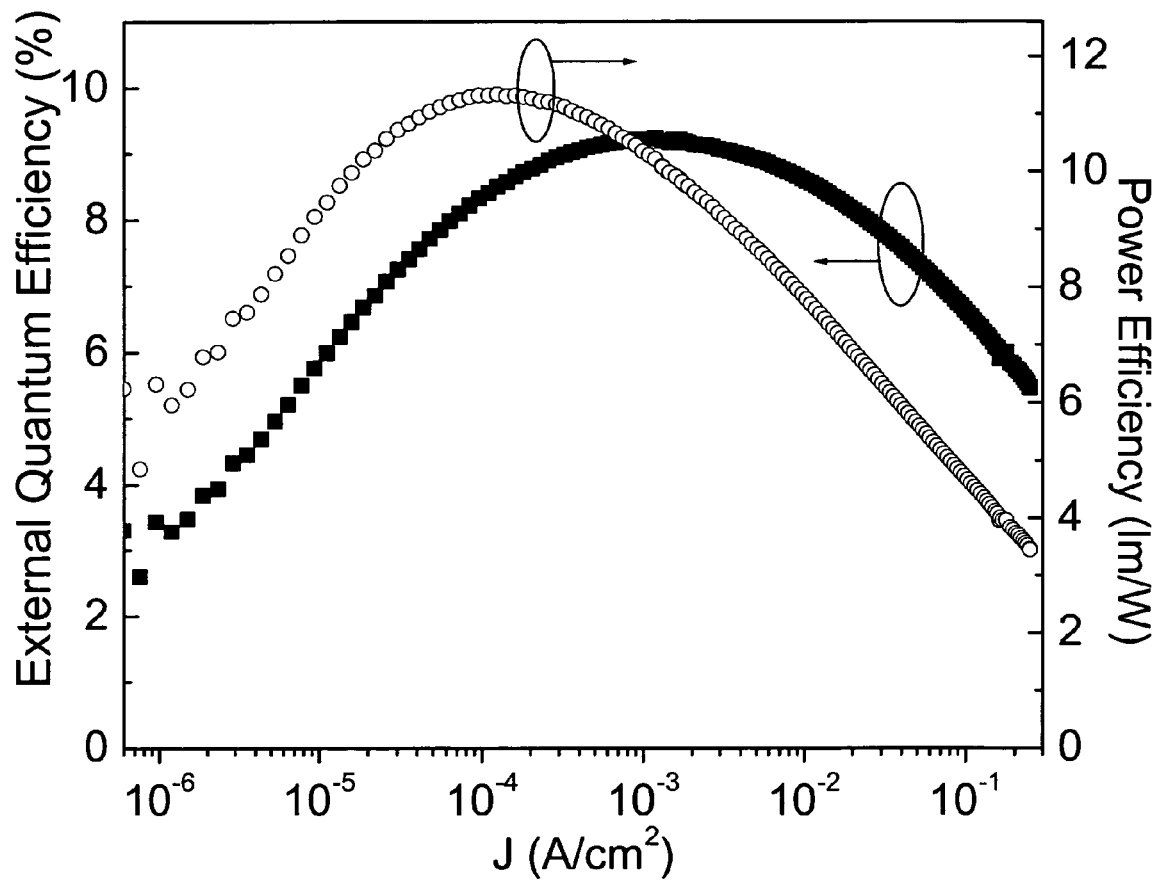
FIG. 6 shows the plots of the external quantum efficiency and the power efficiency versus the current density for the device of Example 1.

FIG. 6 shows the plots of the external quantum efficiency and the power efficiency versus the current density for this device. A quantum efficiency of 9.2% was achieved at 360 cd/m$^2$. This is believed to be the highest quantum efficiency at this high cd/m$^2$ in a published device. A power efficiency (front viewing) of 11.3 lm/W was achieved. The power efficiency (total) was 19.2 lm/W 19.9 cd/A at 1.8 mA/cm$^2$.

A very small roll-off effect of $\eta_{ext}$ was observed, even at large current density ($\eta_{ext}$ is higher than 6% over a wide range of J, $10^{-3}$~$10^2$ mA/cm$^2$. It is believed that that no reported WOLED has achieved this). Triplet-triplet annihilation is reduced by moving the phosphorescent layers away from the exciton generation region, which has highly concentrated local triplet density. This is also confirmed in the following Example 3.

Figure 7:
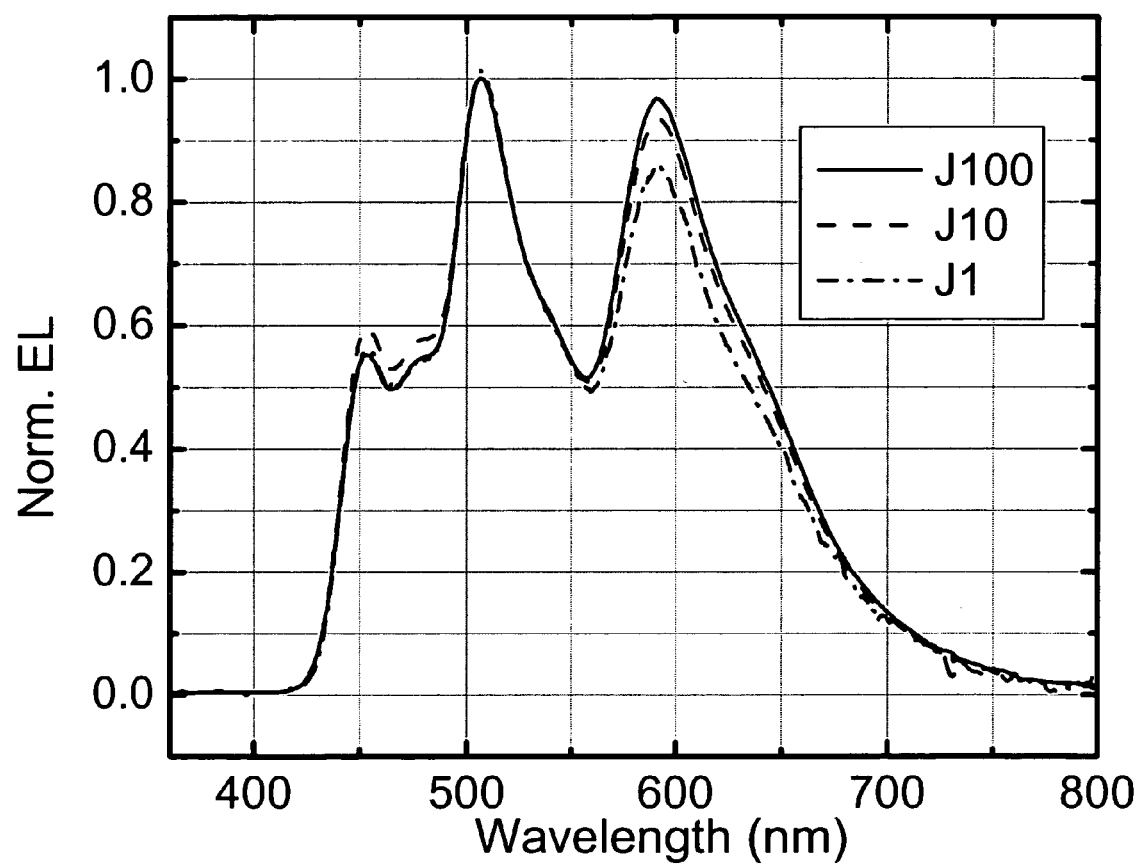
FIG. 7 shows the normalized emission spectrum of the device of Example 1 at current densities of 1, 10 and 100 mA/cm$^2$.

FIG. 7 shows the normalized emission spectrum at various current densities. The CIE coordinates of (0.371, 0.401), and (0.362, 0.400) were observed at current densities of 100 mA/cm$^2$ and 1 mA/cm$^2$, respectively. This indicates a low color dependence on current density, implying its promising application in indoor lighting. A Color Rendering Index (CRI) of 85 was observed at all of the three values of current density. It is believed that this is the highest CRI reported for such a device.

Figure 8:
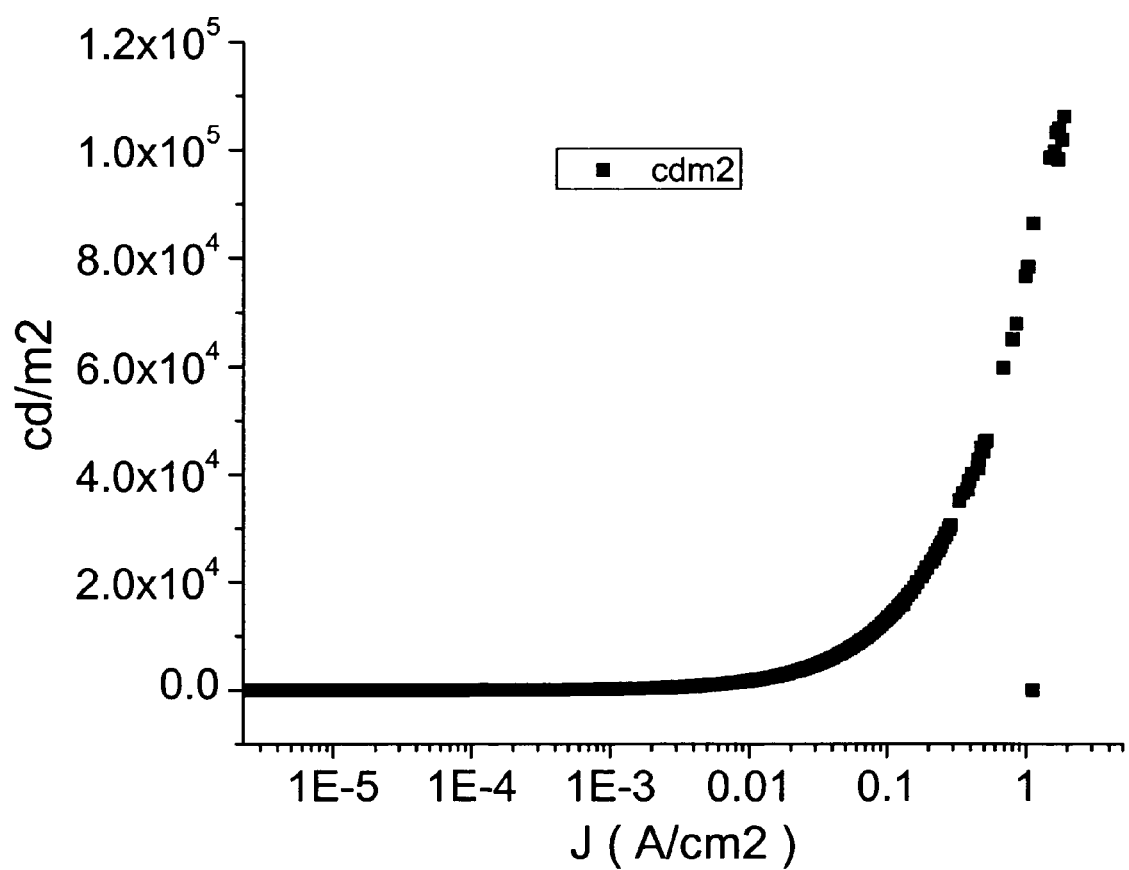
FIG. 8 shows the plot of brightness (cd/m$^2$) versus current density (mA/cm$^2$) for the device of Example 1.
Figure 9:
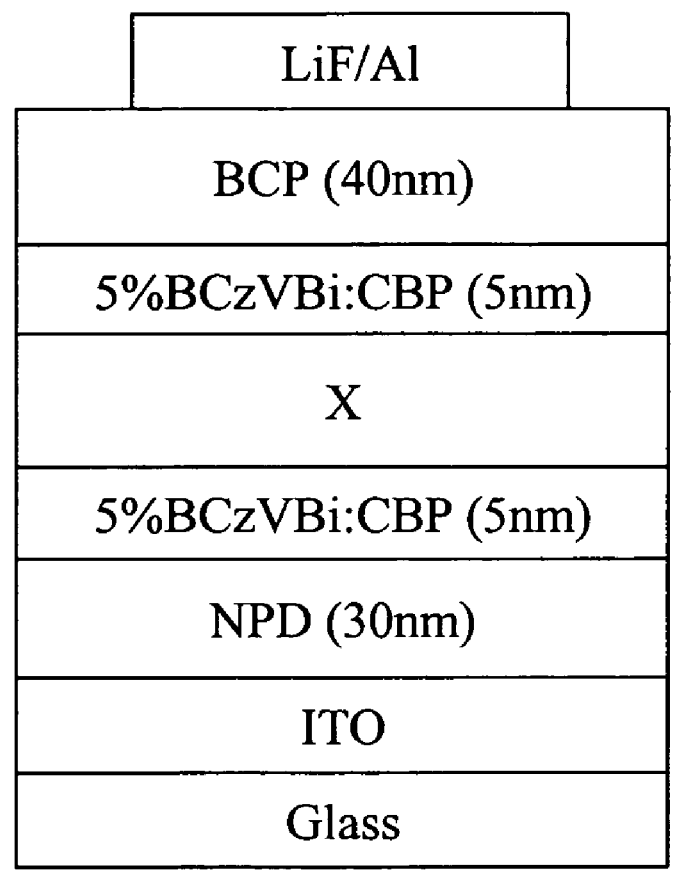
FIG. 9 shows the device structure of the devices of Example 2.

FIG. 8 shows the plot of brightness (cd/m$^2$) versus current density (mA/cm$^2$). A maximum brightness of 86000 cd/m$^2$ (at 1.1 A/cm$^2$, 12.3V) was observed. It is believed that this represents the highest brightness ever reported for a WOLED.

Example 2

Devices were prepared having the following structures for the emissive region:
I: NPD 300 Å/CBP:BCzVBi (5%, 50 Å)/CBP (160 Å)/CBP:BCzVBi (5%, 50 Å)/BCP 400 Å
II: NPD 300 Å/CBP:BCzVBi (5%, 250 Å)/BCP 400 Å
III: NPD 300 Å/CBP:BCzVBi (5%, 50 Å)/CBP (50 Å)/CBP:Ir(ppy)$_3$ (2%, 150 Å)/CBP (50 Å)/CBP:BCzVBi (5%, 50 Å)/BCP 400 Å

Maximum quantum efficiencies of 2.6%, 2.7%, and 5.2% were measured for device I, II, and III, respectively.

Figure 10:
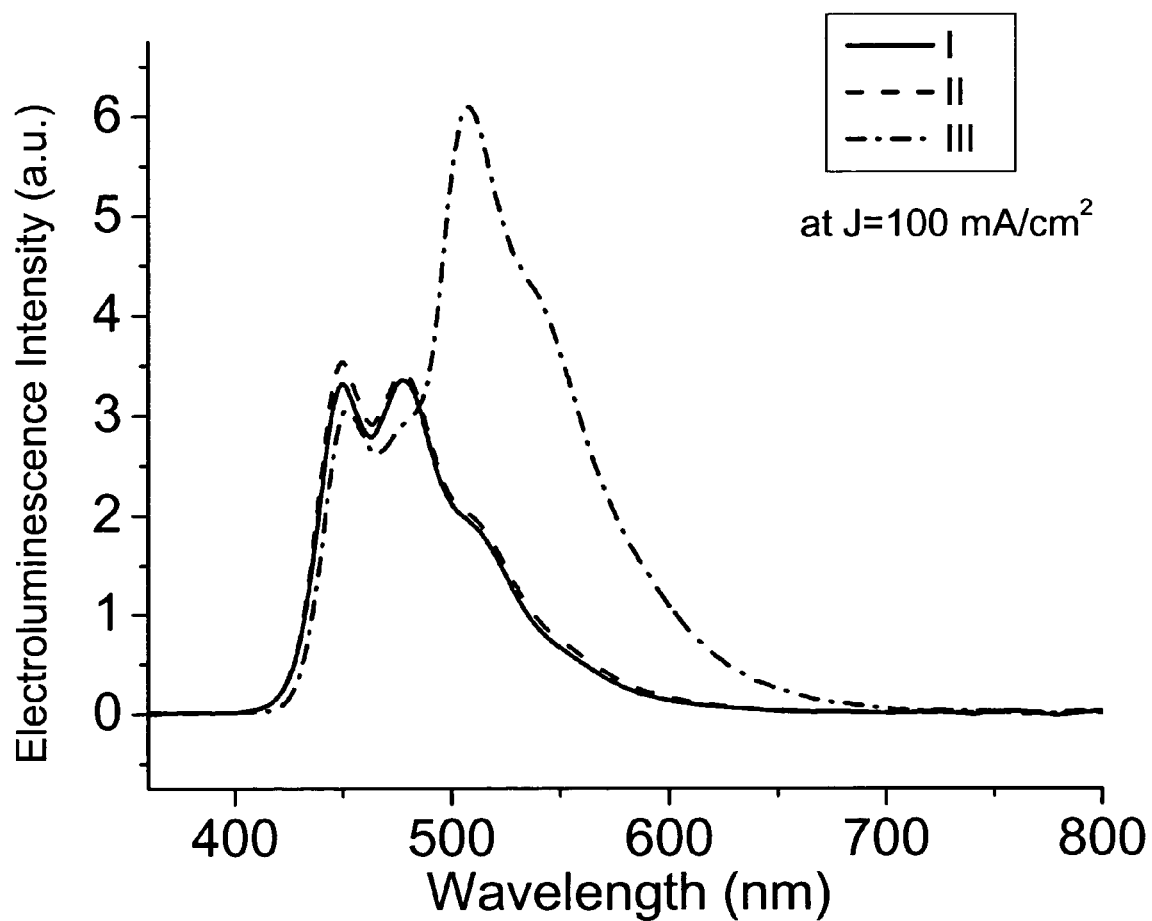
FIG. 10 shows the emission spectrum of the devices of Example 2 at a current densities of 100 mA/cm$^2$.
Figure 11:
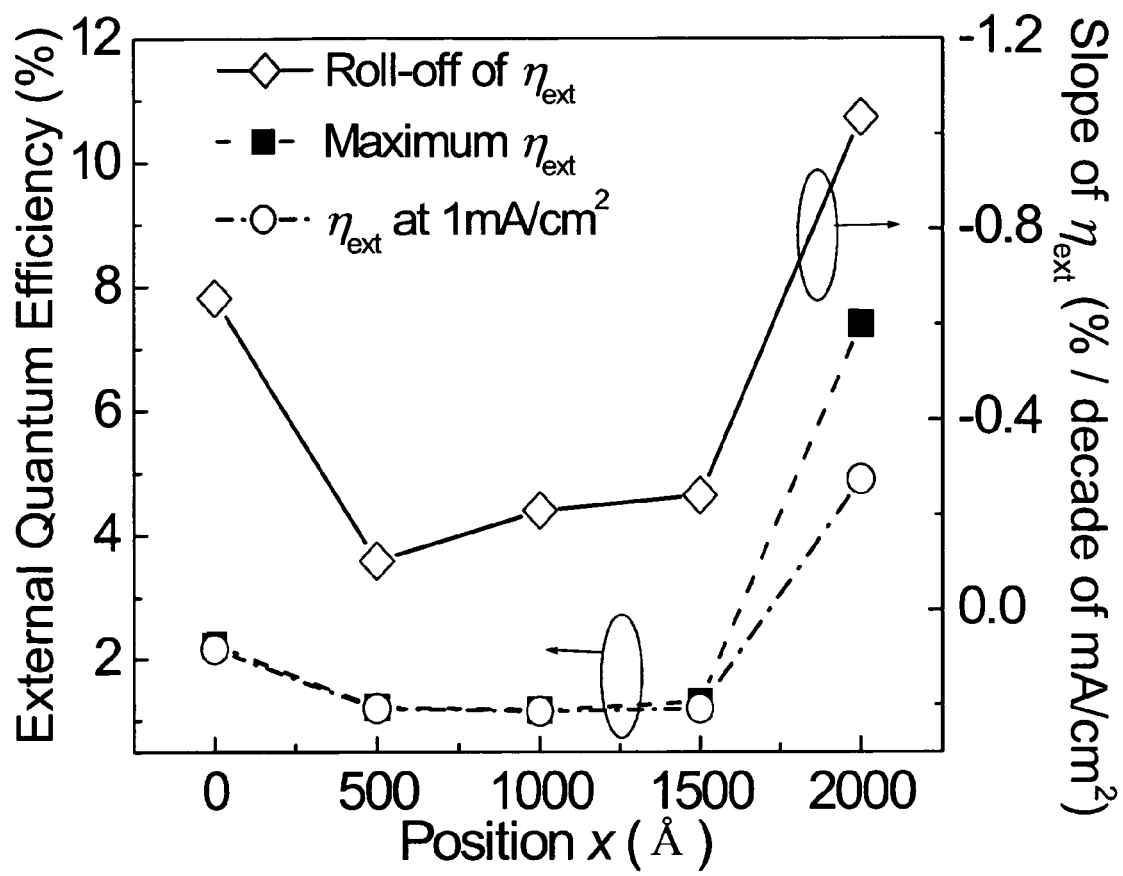
FIG. 11 shows the plots of the external quantum efficiency and slope of external quantum efficiency versus current density for the devices of Example 3.

FIG. 10 shown the emission spectrum of the devices I, II, and III at a current densities of 100 mA/cm$^2$. Comparison of the non-normalized electroluminescence (EL) intensity for these three devices shows that insertion of an extra fluorescent layer in the middle of the emissive region does not give extra fluorescent emission. This confirms that the excitons are mainly generated at NPD/CBP and CBP/BCP interfaces, where charge carriers accumulate. Together with the fact that no CBP emission at short wavelength is observable in either device I or device III, although both devices have non-doped CBP layer(s) as spacer between doped layers, shows that the charge carrier density is very low in the middle region of EML and singlets are completely filtered by BCzVBi doped layers. However, device III shows that the insertion of a phosphorescent layer in the emissive region enhances the efficiency to $\eta_{ext}$=5.2% and the extra phosphorescent emission does not undermine the fluorescent emission intensity. This indicated that Ir(ppy)$_3$ can not be an efficient trap, otherwise carriers removed by Ir(ppy)$_3$ would result in a decrease in the BCzVBi emission. This demonstrates CBP triplet states diffuse through BCzVBi and CBP layers to the phosphorescent doped region.

Example 3

Devices were prepared having the following structures for the emissive region: NPD (300 Å)/CBP (x Å)/CBP:Ir(ppy)$_3$ (5%, 50 Å)/CBP ((2000−x) Å)/BCP (330 Å) with x=0, 500, 1000, 1500 and 2000 Å for device I, II, III, IV, and V respectively.

The trend of $\eta_{ext}$ vs. position x indicates local triplet density is much higher at HTL/EML and EML/ETL interfaces than in the middle region of CBP emission layer, which agrees with the previous discussion about exciton formation zone and triplet diffusion. The comparison of the roll-off effect due to triplet-triplet annihilation by plotting the decreasing slope of $\eta_{ext}$ per decade of current density for these five devices shows that the roll-off effect is much stronger when the phosphorescent-doped region is adjacent to the exciton generation zone than when the phosphorescent-doped region is 500 Å away from it. This agrees with the reduced roll-off effect of $\eta_{ext}$ observed in the devices of the invention compared with other reported WOLEDs using all phosphorescent dopants.

Example 4

Devices were prepared having the following device structures:
NPD 300 Å/CBP:BCzVBi (5%, 100 Å)/ CBP (x Å)/ CBP: PQIr 3%:Irppy 1%(200 Å)/CBP (x Å)/ CBP:BCzVBi (5%, 50 Å)/BCP 400 Å

Figure 12:
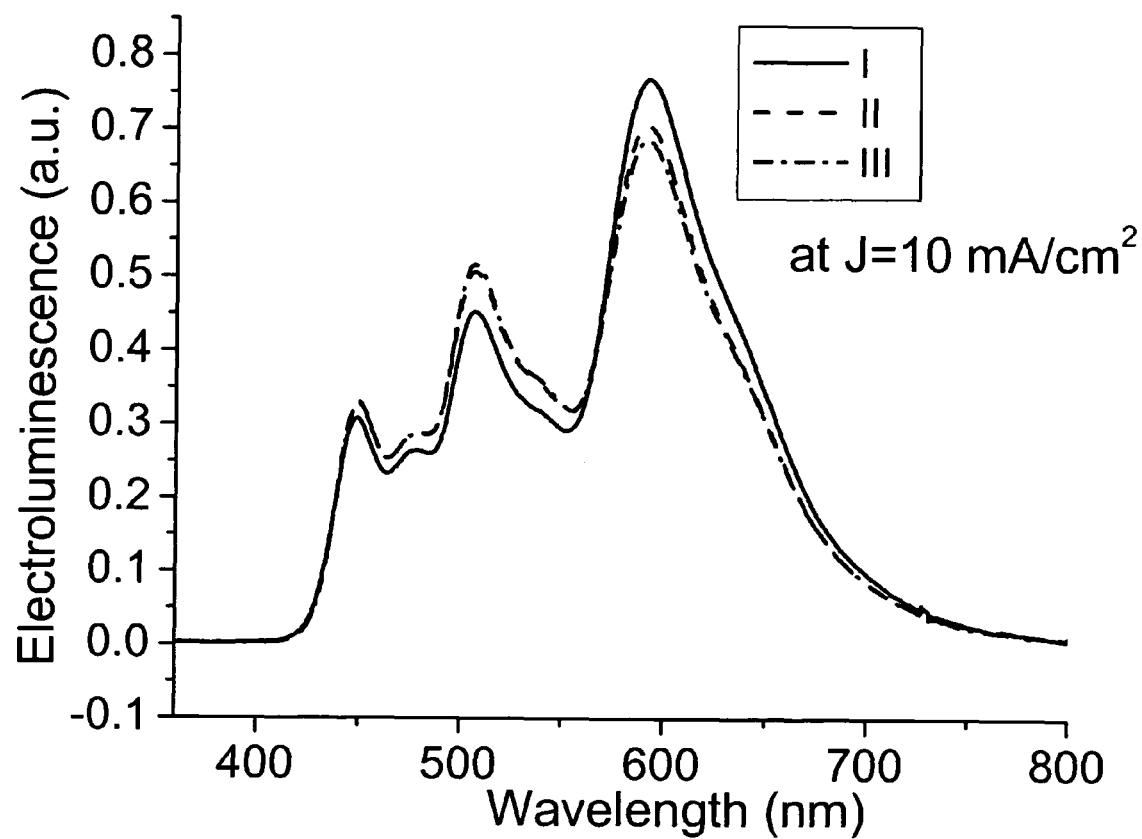
FIG. 12 shows the emission spectrum of the devices of Example 4 at a current density of 10 mA/cm$^2$.

Device I: x=100:$\eta_{ext}$=7.9%, $\eta p$=9.0 lm/W
Device II: x=70:$\eta_{ext}$=8.0%, $\eta p$=8.2 lm/W
Device III: x=40:$\eta_{ext}$=7.9%, $\eta p$=8.4 lm/W FIG. 12 shows the emission spectrum of the devices I, II and III at a current densities of 10 mA/cm$^2$.

The quantum efficiency of devices I, II and III together with the non-normalized electroluminescence intensity comparison indicates that the spacer thickness within a certain range does have a large effect on the performance of WOLED. This is mainly because the spacer thickness is bigger than Förster radius while much smaller than the diffusion length in CBP.

Example 5

Devices were prepared having the device structure:
ITO/NPD 300Å/CBP:BCzVBi 5% b$_1$ Å/CBP 40Å/CBP:PQIr 4% r Å/CBP:Irppy 5% g Å/CBP 40Å/CBP:BCzVBi 5% b$_2$ Å/ETL/LiF/Al.
  Device I: ETL=200 Å BPhen/200 Å Li:BPhen(1:1); b$_1$=200 Å; b$_2$=50 Å; r=100 Å; g=100 Å.
  Device II: ETL=400 Å BCP; b$_1$=100 Å; b$_2$=100 Å; r=120 Å; g=80 Å.

Devices were fabricated by doping the middle region of the emissive region with both green (Irppy) and red (PQIr) phosphorescent dopants. Since the high HOMO energy of PQIr suggests that it can trap holes in the CBP host, a slight decrease of the blue emission intensity is observed in the device. Fitting the device spectrum to the individual dopant spectra suggests that the ratio of emission from fluorescent to phosphorescent dopants approaches the ration of 1:3, consistent with the single-to-triplet exciton formation ratio in emissive organic materials. Furthermore, given the performance characteristics of the purely fluorescent BCzVBi device (Device II, Example 2), the fraction of excitons trapped by, and formed directly on the phosphorescent dopants in the emissive region is calculated as $\chi_{trap}$=(28±5)%. That is, approximately 30% of the excitons are formed by direct trapping on the phosphorescent dopants, whereas the remaining 70% are formed at the edges of the emissive region, at which point the triplets subsequently diffuse into the center where they are transferred from the host to the phosphorescent dopant prior to emission.

Figure 13:
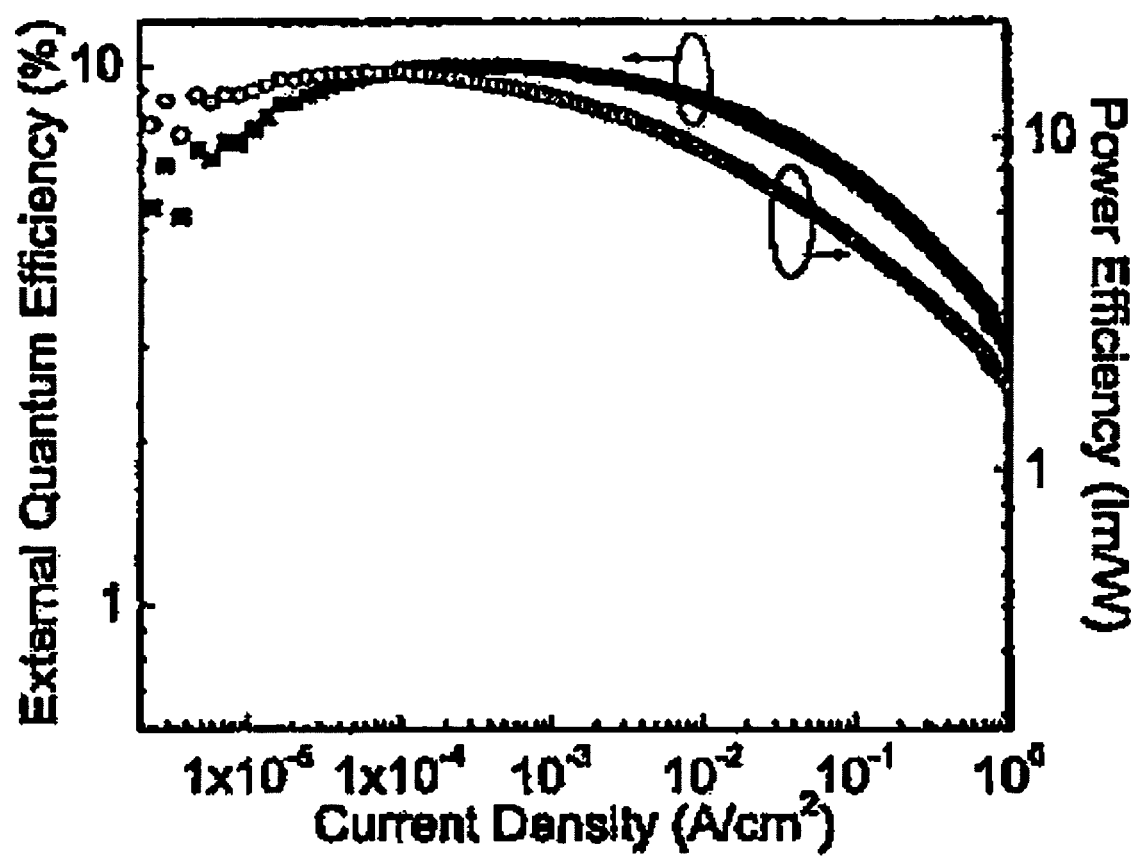
FIG. 13 shows the forward viewing external quantum efficiency (solid squares) and power efficiency (open circles) versus current density for the device of Example 5.

A maximum forward viewing EQE of $\eta_{ext}$=(10.0±0.3)% is achieved at a current density of J=(1.3±0.5)mA/cm$^2$ (corresponding to a high surface luminance of ~450 cd/m$^2$), as shown in FIG. 13. This corresponds to a maximum forward viewing power efficiency of $\eta_P$=(15.8±0.3) lm/W. The brightness at 1 A/cm$^2$ is (91,000±7000) cd/M$^2$. The drive voltage for the device is (6.5±0.5)V at J=10 mA/cm$^2$. Since illumination sources are generally characterized by their total emitted power, this device therefore has a total power efficiency of $\eta_{p,t}$=(26.9±0.5) lm/W, and $\eta_{ext,t}$=(17.0±0.5)%. Although the commercially available blue fluorescent emitter has a low $\eta_{ext}$30 2.7% (compared with a maximum expected 5% achieved in the literature), the device performance, nevertheless, represents a considerable improvement over the best all-phosphorescent devices previously reported.

Figure 14:
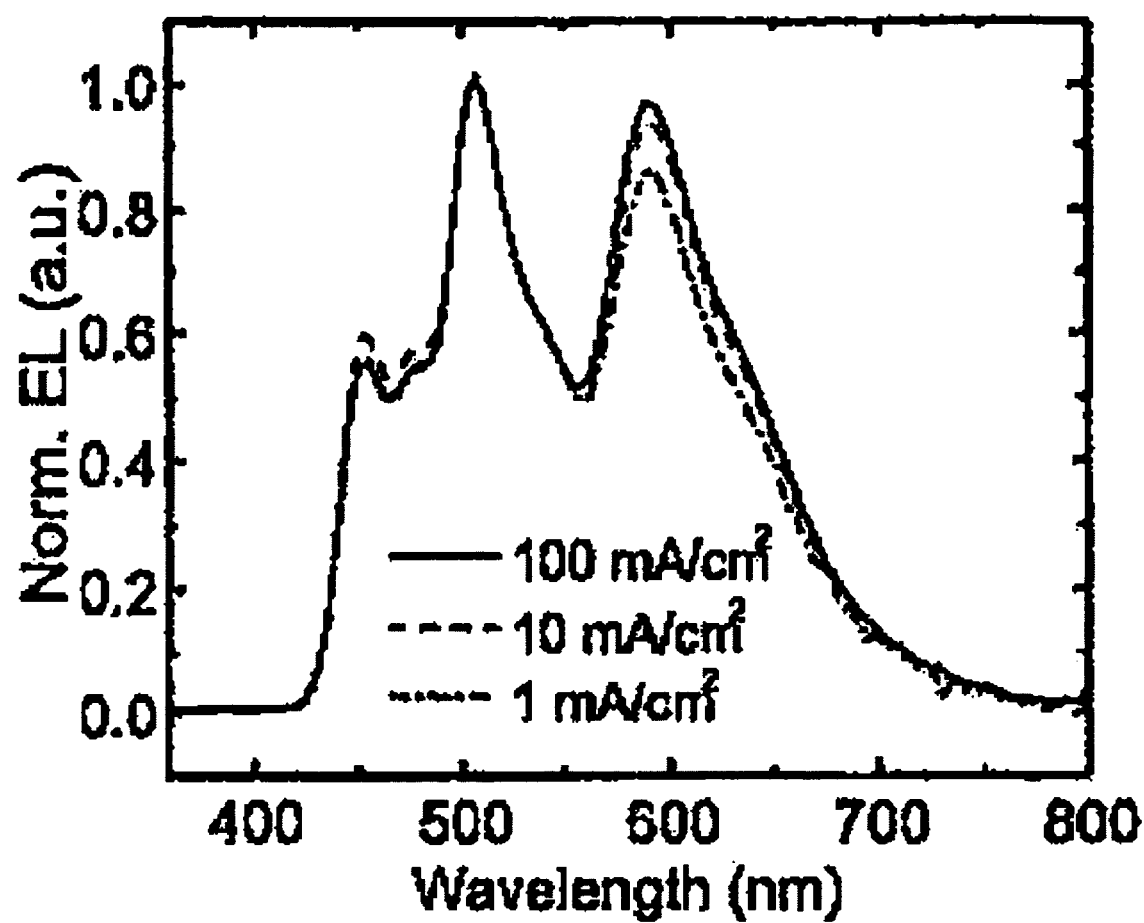
FIG. 14 shows the normalized electroluminescence spectra at various current densities for the device of Example 5.

The intrinsic singlet-to-triplet ratio and the separation of the channels in harvesting the two excitonic species gives a well-balanced and largely current independent color rendition, resulting in a CRI=85 at all current densities studied, which is the highest CRI among the reported values for a WOLED. The CIE coordinates have a negligible shift from (0.36, 0.40) at 1 mA/cm$^2$ to (0.37, 0.40) at 100/cm$^2$. This differs from observations of an all-phosphorescent-doped WOLED, where blue emission generally becomes stronger with increasing driving voltage due to the requirement for high energy excitation of the blue phosphorescent dopant. In FIG. 14 are images of three devices, each driven at 4 times higher drive current than the device above it (from 3 to 12 mA/cm$^2$) in the array (equivalent to two f-stop difference in illumination) to show the color stability of the emission.

To interpret the emission spectrum, the device EQE is expressed as $$\eta_{ext}=(1-\chi_{trap})\cdot\eta_B+[(1-\chi_{trap})\cdot\chi_1+\chi_{trap}]\cdot\eta_{GR} \quad \text{(Eq. 1)}$$

where $\eta_B$ and $\eta_{GR}$ are the external quantum efficiencies of a singly doped blue fluorescent device, and the comparable singly doped green and red phosphorescent devices, and $\chi_{trap}$ is the fraction of excitons trapped and formed directly on the phosphorescent dopants in the emissive region. By fitting the device spectrum of FIG. 14 at J=mA/cm$^2$ with the electroluminescence spectra of the three individual dopant materials, and accounting for photon energy in these power spectra, we find that (19±2)% of the total quantum efficiency is due to emission from the blue fluorescent dopant, and (81±2)% is from the green and red phosphorescent dopants. Given the performance characteristics ($\eta_B$) of the purely BCzVBi device (Device II, Example 2), we calculate $\chi_{trap}$=(28±5)% from the first term in Eq. 1.

Bphen is employed in Device I in order to further reduce device drive voltage. The CRI achieved with Device I and Device II are nearly identical.

Example 6

Devices were prepared having the following structures:
ITO/NPD (300 Å)/CBP (x Å)/CBP:Ir(ppy)$_3$ (5%, 50 Å)/CBP ((2000−x) Å)/BCP (400 Å)/LiF/A1 with x=0, 500, 1000, 1500 and 2000 Å for device I, II, III, IV, and V respectively.

Figure 15:
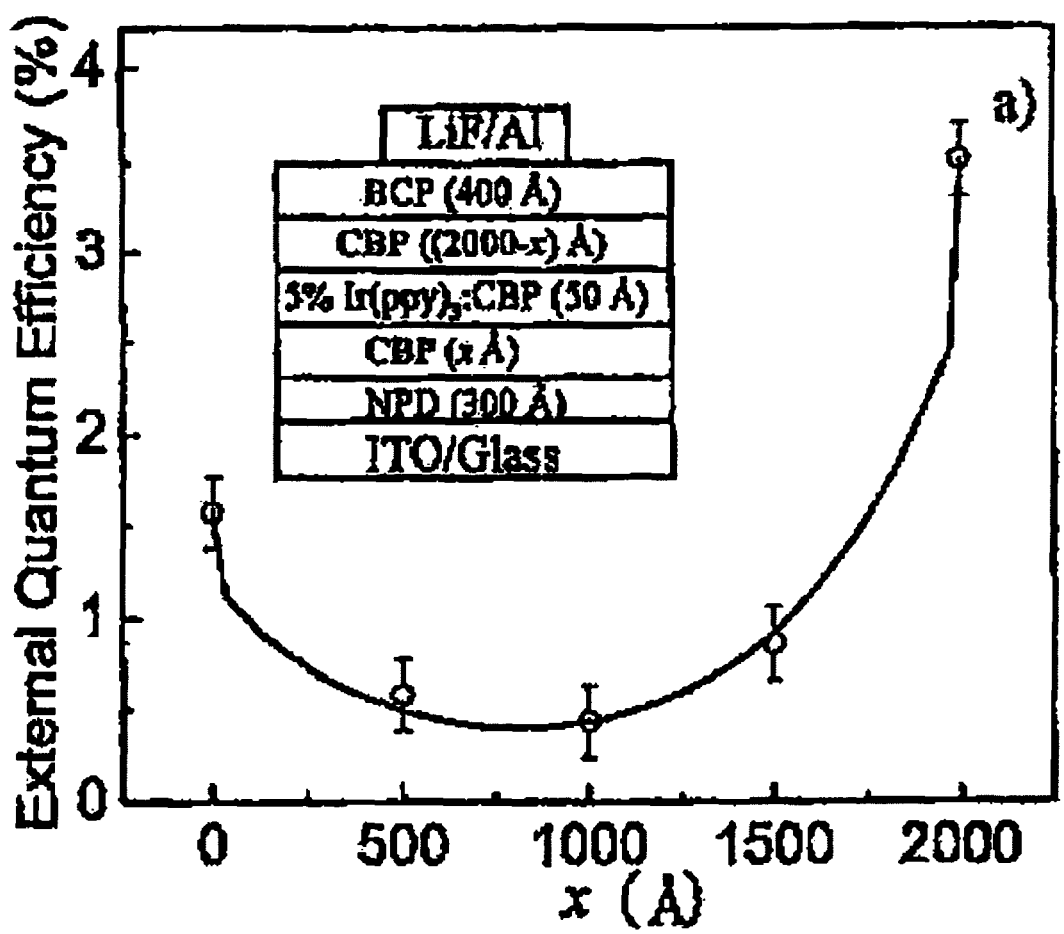
FIG. 15 shows the plot of external quantum efficiency due to Irppy emission against the position of a thin (50 Å) slab of 5 wt % Irrpy in CBP located at various distances from the HTL/emissive layer (EML) interface within a 200 nm thick CBP EML.

FIG. 15 shows the plot of external quantum efficiency due to Irppy emission against the position of a thin (50 Å) slab of 5 wt % Irrpy in CBP located at various distances from the HTL/emissive layer (EML) interface within a 200 nm thick CBP EML.

Exciton diffusion through the emissive region is modeled as shown in FIG. 26a (solid lines) as follows: In steady state, and assuming that all singlet formation occurs at HTL/EML (x=0), and EML/ETL interfaces (x=2000 Å) (in FIG. 26a), a solution to the triplet diffusion equation gives:

$$n(x)=[1/\sin h(L/L_D)][\chi_t\cdot n_R\cdot\sin h(x/L_D)]+\chi_s\cdot n_L\cdot\delta(x)+\chi_s\cdot n_R\cdot\delta(x-L) \quad \text{(Eq. 2)}$$

where n is the total exciton density: n(x=0)=n$_L$ and n(x=L=200 nm)=n$_R$, LD is the triplet diffusion length, and the delta function terms account for the presence of contributing singlets at the interfaces. Since the EQE from Irrpy emission is proportional to the exciton density in the Ippy-doped slab, FIG. 15 (solid curve) shows the fit of the efficiency at J=19 mA/cm$^2$ versus x using Eq. 2 and $\chi_t=^3\chi_s$, from which is inferred L$_D$=(460±30)Å. With this calculated diffusion length, integration of the total exciton density in the phosphorescent doped region in the device predicts that (75±5)% of the phosphorescent emission results from triplet diffusion from the adjacent EML interfaces, in agreement with the value calculated from the spectral content of the emission (Eq. 1).

Figure 16:
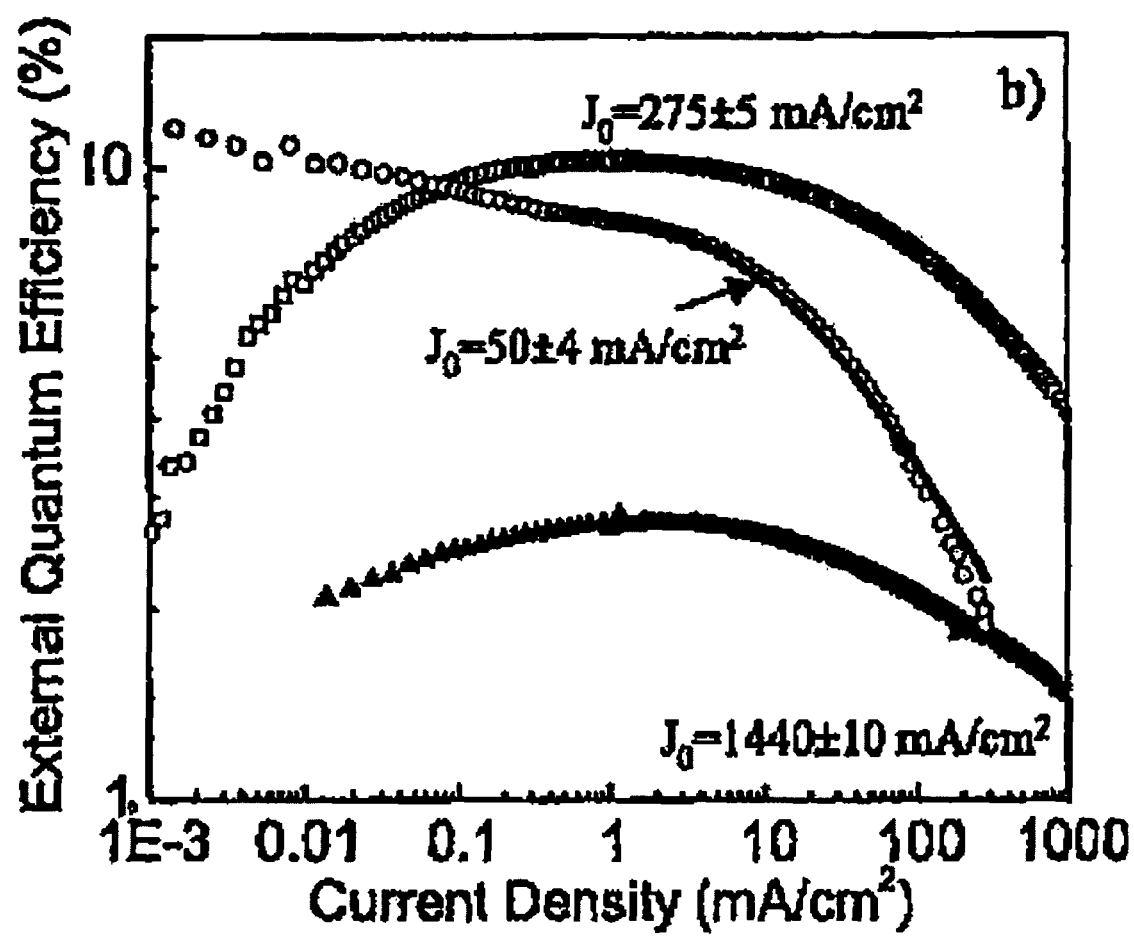
FIG. 16 shows a comparison of external quantum efficiency roll-off. Open circles depict the performance of an all-phosphorescent white device, in comparison to the white device of Example 5 (squares), and a blue fluorescent BCz-VBi device (triangles).

FIG. 16 shows a comparison of external quantum efficiency roll-off. Open circles depict the performance of the all-phosphor white device described in D'Andrade et al., Advanced Materials, 16, 624-627 (2004), in comparison to the white-emitting device of Example 5(I) (squares), and a blue fluorescent BCzVBi device (triangles). The high current roll-off of the all-phosphorescent device is described by triplet-triplet annihilation (fit shown as a solid line), yielding an onset current density $J_0=(50\pm4)$ mA/cm$^2$. The device of Example 5(I) clearly demonstrates a roll-off which appears qualitatively similar to that of the all-fluorescent device. For comparison. $J_0=(275\pm5)$ mA/cm$^2$ and $J_0=(1440\pm10)$ mA/cm$^2$ for the device of Example 5(I) and the all-fluorescent device, respectively.

Example 7

To improved the understanding of the diffusive process in the devices of the invention, we employ optically pumped pseudo-time-of-flight measurements to obtain both the triplet diffusion coefficient, D, and the T-T annihilation rate, $K_{TT}$, for the commonly used OLED host material, 4,4'-bis(N-carbazolyl)biphenyl (CBP). These measurements use the delayed fluorescence from CBP and the delayed phosphorescence from a phosphor-doped "sensing layer" to monitor the evolution of the triplet spatial profile. In addition, we demonstrate that the diffusion coefficient is decreased by doping into CBP a wide energy-gap molecule that scatters triplets and frustrates their transport. The results are employed to understand the mechanisms that control the performance of fluorescent/phosphorescent WOLEDs, and to determine the limitations of such an architecture using CBP as a host material.

Figure 17:
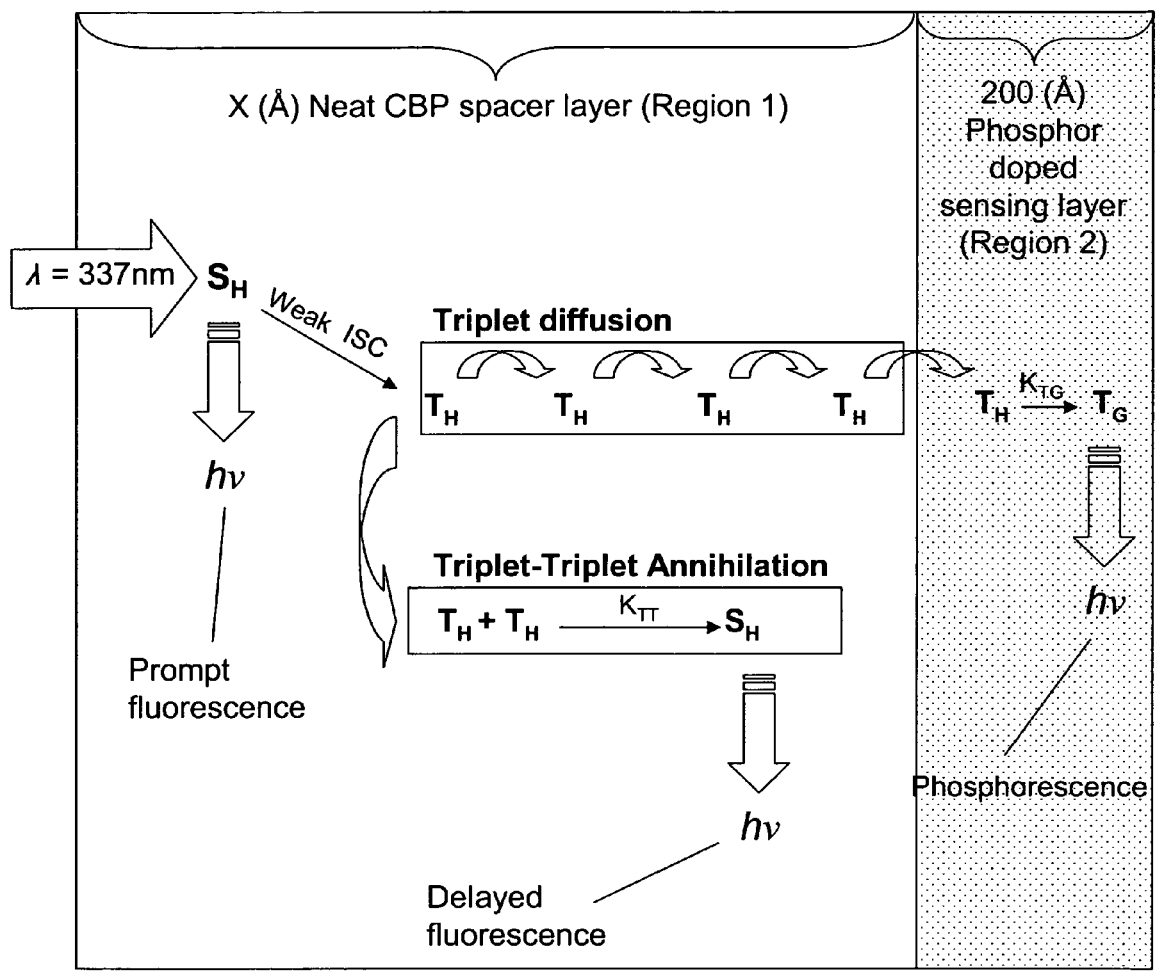
FIG. 17 shows a schematic illustration of the sample structure and of the light emission process in the time-of-flight experiments.

A schematic of the sample structure, as well as the processes leading to luminescence, are shown in FIG. 17. For all samples, a 200 Å thick layer of CBP doped at 1 wt % with a phosphorescent emitting material is thermally evaporated onto the surface of a freshly cleaned and deoxidized Si substrate. The phosphorescent emitting materials used Ir(ppy)$_3$, emitting in the green, and PQIr that emits in the red. The doped layer functions as a triplet "sensor" since CBP triplets transfer to, and localize on the lower energy triplet state of the phosphorescent emitting materials. Phosphorescent emission thus serves to indicate the presence of CBP triplets in the doped region. Since the rate of triplet transfer depends strongly on energetic resonance between host and guest, the use of Ir(ppy)$_3$ and PQIr, which have different triplet energies (see Table 1) allows host-guest triplet transfer in the sensing layer to be isolated from that of diffusion in CBP.

A CBP spacer layer of thickness, X, varied between 100 Å and 1200Å, is deposited on the sensing layer surface. Prior to deposition, all organics are purified at least once by train sublimation (S. R. Forrest, Chem. Rev. 97, 1793-1896 (1997)), and all deposition is carried out at a growth rate of approximately 3 Å/s in vacuum at a base pressure of 10$^{-7}$ Torr. Immediately following deposition, samples are placed in a closed-cycle He cryostat, and the chamber is evacuated to roughly 50 mTorr.

The output of a pulsed N$_2$ laser was focus (<1 ns pulse width; wavelength $\Lambda=337$ nm; pulse energy from 0.9 to 4.1 µJ) onto a 2 mm diameter spot incident on the spacer layer surface. Each pulse generates an exponentially decaying singlet density spatial profile according to the measured CBP absorption coefficient of $\alpha=2.0\times10^5$ cm$^{-1}$ at the pump laser wavelength. Neither interference effects nor absorptive saturation are expected to significantly change this excited state profile. Using the above parameters at a pulse energy of 4.1 µJ, an initial singlet density of $(2.9\pm0.4)\times10^{19}$ cm$^{-3}$ was estimated at the film surface on which the beam is incident. The resulting luminescence from the samples is focused into a fiber and channeled to a Hamamatsu C4334 streak camera that monitors the time-resolved spectral decay.

The majority of singlets decay within nanoseconds following the optical pulse, while a small fraction cross into the long-lived triplet manifold. N. J. Turro, *Modern Molecular Photochemistry* (University Science Books, Menlo Park, Calif., 1991). The concentration gradient stemming from the large optical absorption coefficient results in net diffusion towards the sensing layer. During diffusion, triplets may annihilate to produce delayed fluorescence. FIG. 17 schematically illustrates the decay progression.

This is a pseudo-time-of-flight (TOF) experiment since varying the spacer layer thickness changes the time that it takes for the bulk of the triplet population to diffuse into the sensing layer to produce phosphorescence. The incident laser intensity was varied by a factor of 5 to control the initial triplet excitation density. This affects the amount of T-T annihilation (and hence delayed fluorescence intensity).

Figure 18:
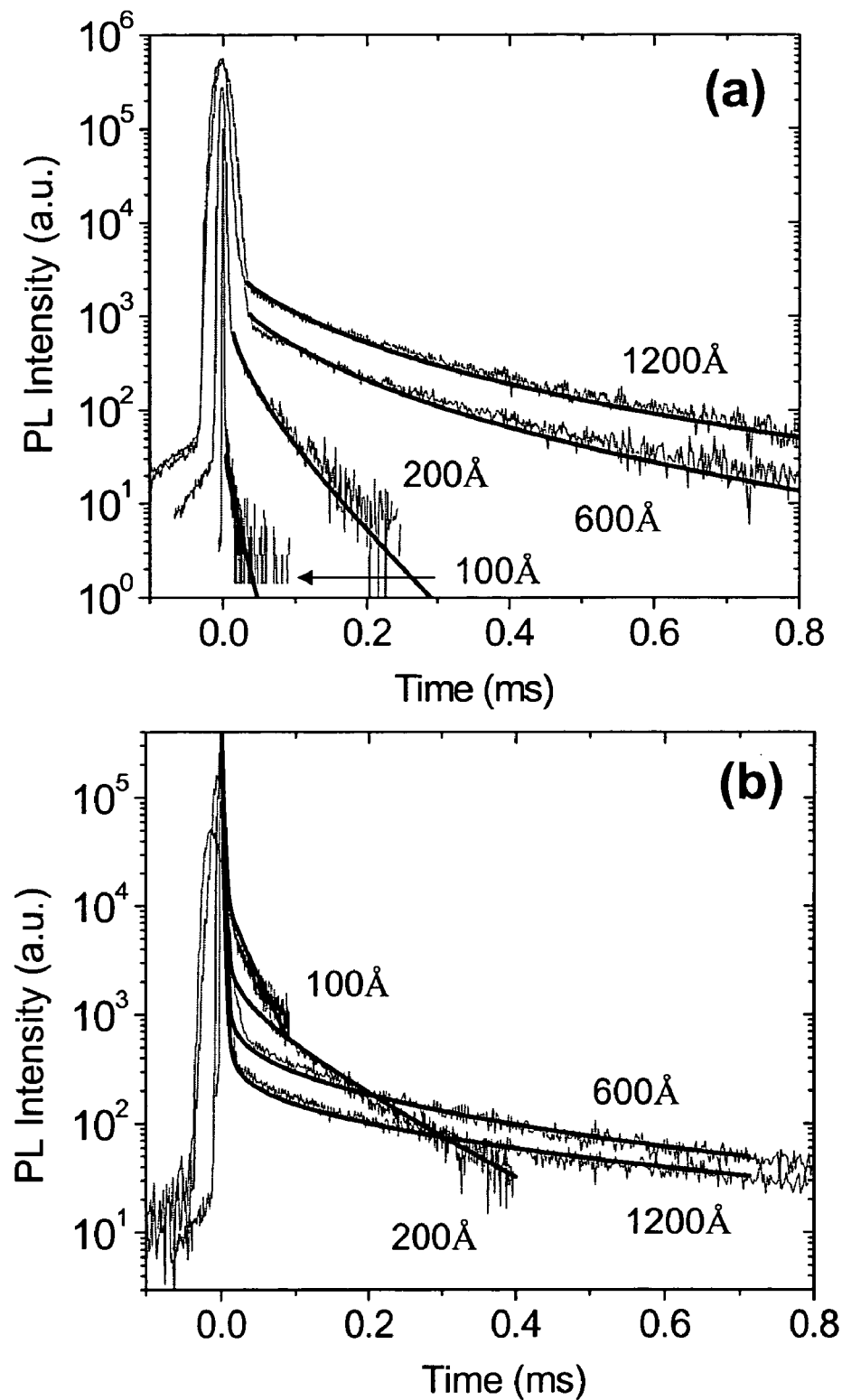
FIG. 18 shows the spectrally resolved photoluminescence (PL) transients for Ir(ppy)$_3$ doped in CBP as the sensing layer. The spacer layer thickness ranges from 100 Å to 1200 Å. The large peaks at the start of each transient are due to prompt fluorescence and phosphorescence. The delayed fluorescence transient from CBP is shown in (a), with the corresponding Ir(ppy)$_3$ phosphorescence in (b).
Figure 19:
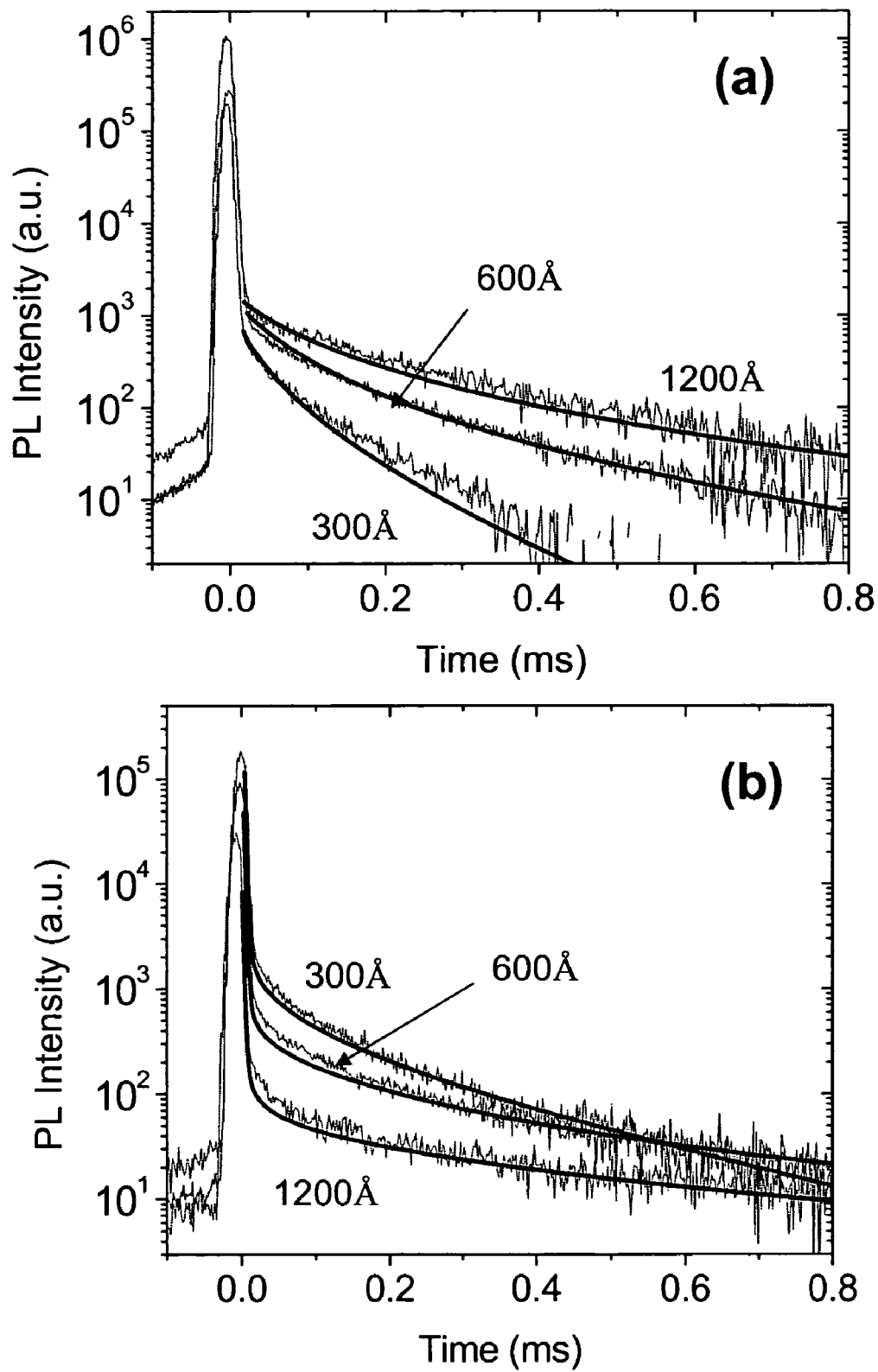
FIG. 19 shows the spectrally resolved photoluminescence (PL) transients for samples using a PQIr doped CBP sensing layer. The spacer layer thickness ranges from 300 Å to 1200 Å. The delayed fluorescence transient from CBP is shown in (a), with the corresponding PQIr phosphorescence in (b).

The results of the TOF transient experiments are shown in FIGS. 18 and 19 for two different sets of samples employing Ir(ppy)$_3$ and PQIr as the sensing layer dopant, respectively. These plots show the decay of the delayed fluorescence and the sensing layer phosphorescence for different spacer thicknesses, X. No significant change in the shape of either the delayed fluorescence or phosphorescence transient decay occurs as X varies from 1200 Å to 600 Å, while the decay for both accelerates for $X\leq300$ Å. This reflects a balance reached between the losses that occur in the spacer and the increased decay rate in the sensing layer due to the presence of the phosphorescent molecules.

The thickness of the spacer layer in relation to both the optical absorption and triplet diffusion lengths is one factor that determines the balance between the various decay channels. For a thick spacer layer, the majority of triplets are generated too far from the sensing layer to diffuse to it before they annihilate or otherwise naturally decay. In that case, the delayed fluorescence is intense while the phosphorescence is weak due to the small fraction of triplets that reach the sensor. Conversely, samples with thin spacers show increased phosphorescence intensity and fast decays for both luminescence signals, since diffusion to the sensing layer efficiently competes with annihilation and natural decay.

Figure 20:
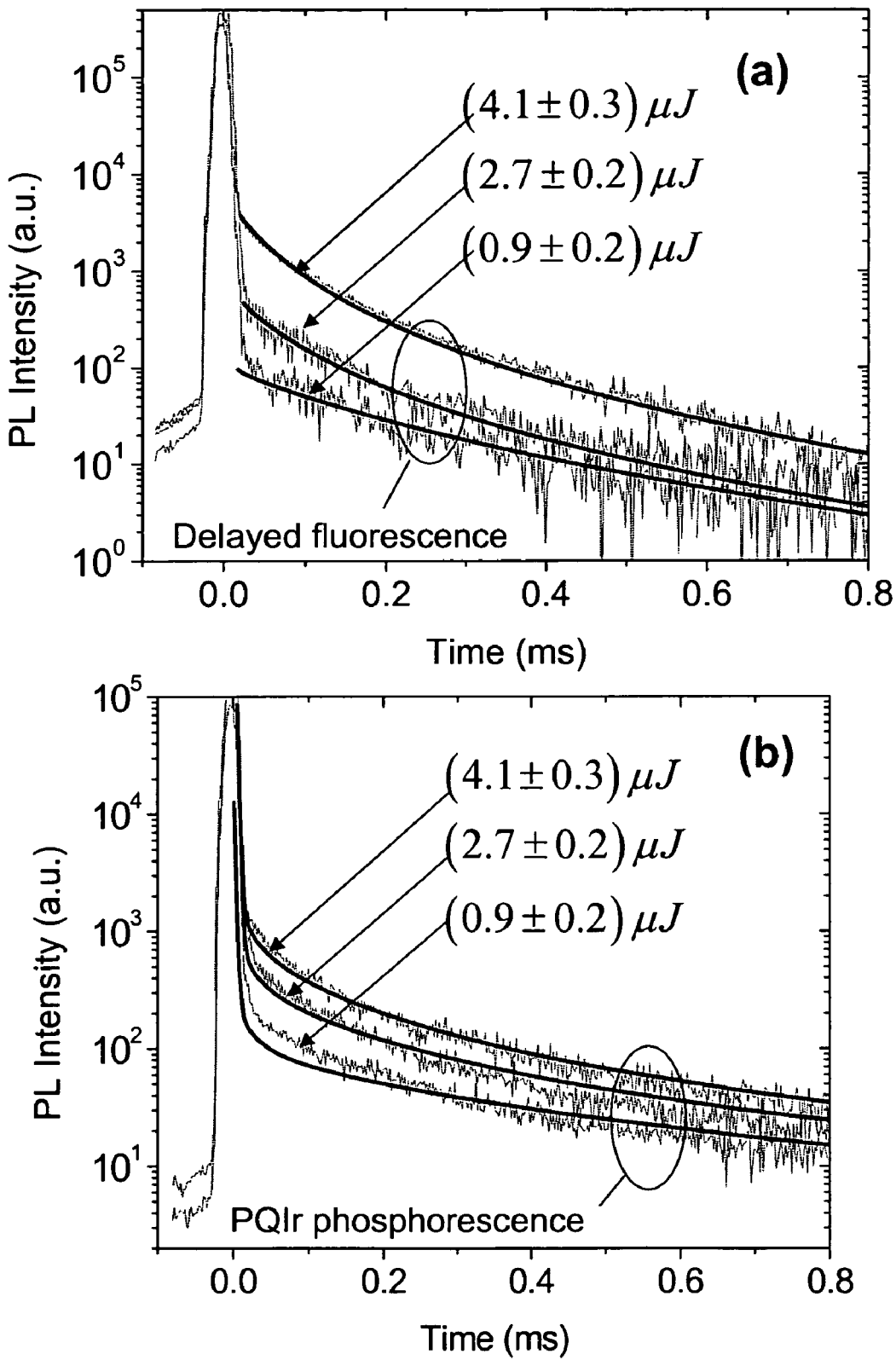
FIG. 20 shows the spectrally resolved photoluminescence transients obtained for several excitation pulse intensities for samples with PQIr doped into CBP as a sensing layer. Subplots (a) and (b) show the delayed fluorescence of CBP, and the phosphorescence of PQIr, respectively. Solid lines show fits calculated for different $T_{H0}$ (listed in Table 2) while holding constant D and $K_{TT}$ at the values given in Table 1.

The intensity of the exciting optical pulse is also a factor in determining the decay transients, since the annihilation rate is proportional to the triplet density. To examine this effect, the pulse energy was varied incident on a sample with a spacer thickness of X=300 Å deposited on a PQIr sensing layer. The transient results are plotted in FIG. 20 for pulse energies ranging from 0.9 µJ to 4.1 µJ. Both luminescent transients decay more slowly and become less intense with decreasing pump fluence, although this trend is most evident in the delayed fluorescence signal.

Scattering or trapping of triplet excitons at defect sites in a thin film are expected to reduce the triplet diffusion coefficient as compared to a defect-free film. We demonstrate this effect by doping into CBP the wide energy gap molecule, UGH2, whose triplet energy is ~3.5 eV; well in excess of the 2.6 eV CBP triplet. Since no energy transfer from the CBP to UGH2 triplet state is possible, the UGH2 molecules scatter triplets and frustrate their movement through the CBP matrix, decreasing the diffusion coefficient.

Figure 21:
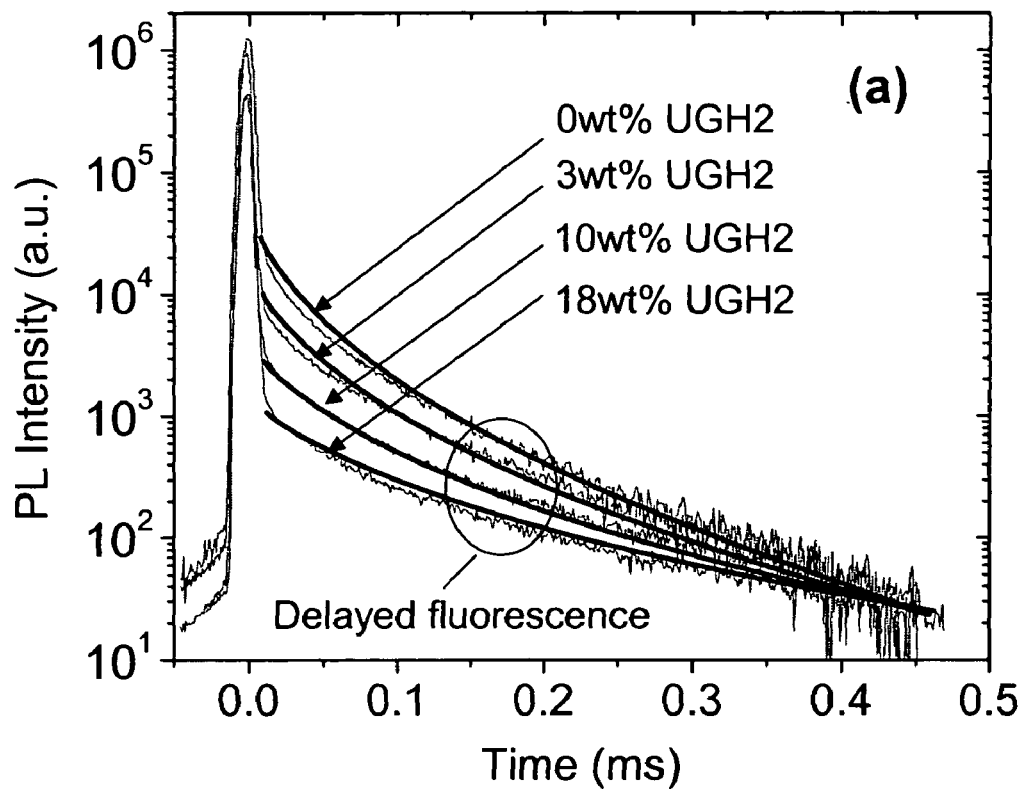
FIG. 21 shows the spectrally resolved delayed fluorescence (a) and PQIr phosphorescence (b) transient data obtained for samples using a PQIr sensing layer with a 300 Å thick CBP spacer layer co-doped with varying concentrations of the wide-gap molecule UGH2. Solid lines indicate fits to the theory in the text by varying D and $K_{TT}$, holding all other parameters constant at the values listed in Table 1.
Figure 21:
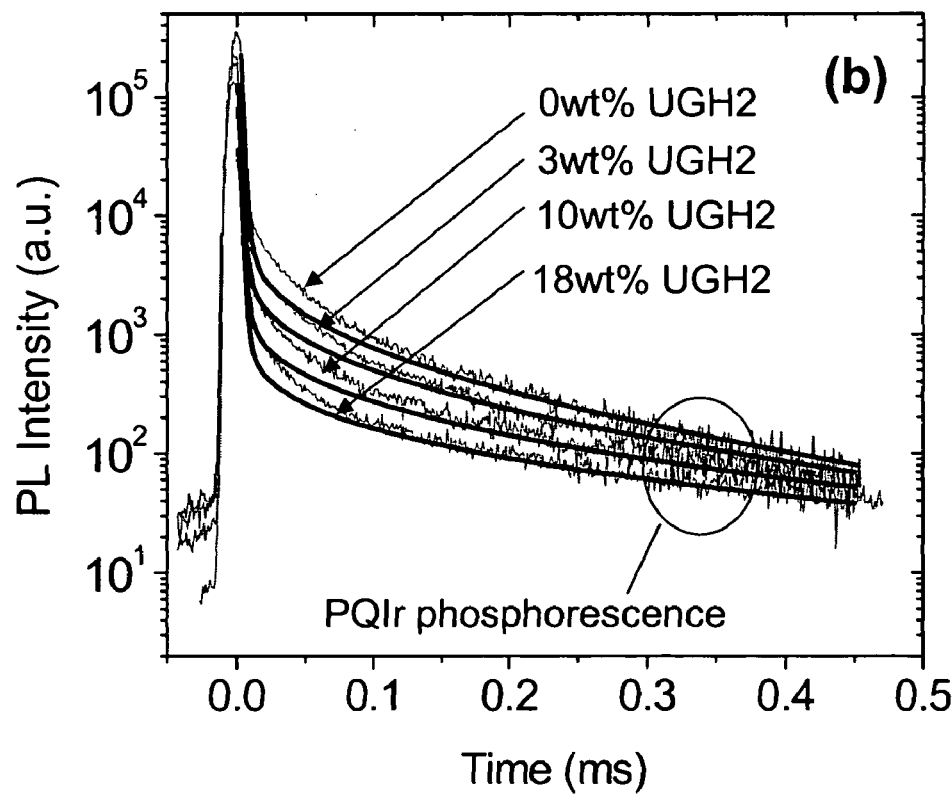

Transient decays are shown in FIG. 21 for samples having 0, 3, 10 and 18 wt % UGH2 doped into a 300 Å thick CBP spacer, using a PQIr-doped sensing layer. Both delayed fluorescence and phosphorescence trend towards lower intensity and slower decays with increasing UGH2 concentration. The reduced delayed fluorescence indicates that the T-T annihilation rate decreases in the presence of UGH2, whereas the decreased and extended phosphorescence signal suggests that triplets take longer to reach the sensing layer. Both of these observations are consistent with a reduced triplet mobility in the spacer layer.

Figure 22:
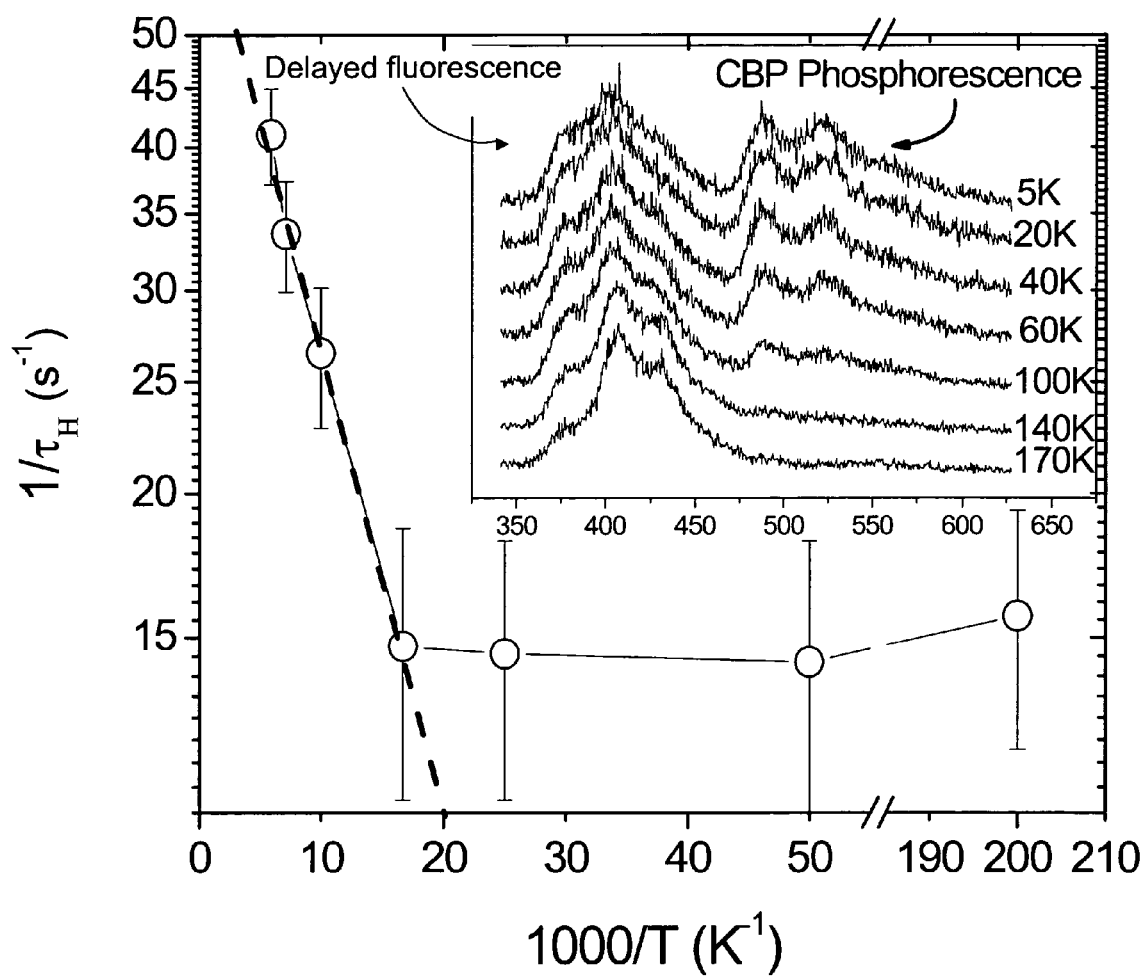
FIG. 22 shows Arrhenius plot of the natural CBP triplet decay rate ($1/\tau_H$) obtained for temperatures in the range from 5K to 170K. The inset shows the spectra of CBP phosphorescence and delayed fluorescence at 1ms following the initial optical excitation pulse.

The natural CBP triplet lifetime, $\tau_T$, was determined at temperatures from 5K to 170K by optically pumping a neat, 500 Å thick film deposited on Si. The phosphorescence decay rates shown in FIG. 22 are obtained from monoexponential fits to the phosphorescence transient for times t>5 ms following the $N_2$ laser pulse to eliminate effects from T-T annihilation. The green CBP phosphorescence with a high-energy edge at λ=480 nm is apparent in the inset of FIG. 22, along with the delayed fluorescence signal centered at λ=410 nm.

As shown in FIG. 22, the natural triplet decay is independent of temperature below ~50K, and is only weakly activated at higher temperatures, with an energy, $E_a$=(9±1) meV. Since $T_1 \to S_0$ intersystem crossing is typically independent of temperature, the lifetime of triplets at higher temperatures is likely limited by quenching with impurities encountered in the course of migration in the film. As temperature increases, levels of higher energy in the triplet density of states (with Gaussian width σ~30 meV) are populated. This increases the exciton mobility, and leads to more frequent encounters with quenching sites, thus decreasing the lifetime. This effect is intrinsic to the CBP films grown in these experiments, and extrapolation of the fit to room-temperature yields the natural triplet lifetime of $\tau_T$=(14±8) ms at T=295K.

The encounter of two triplet excitons ($T_1$) may result in an annihilation reaction that proceeds as:

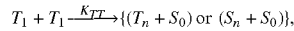

$$T_1 + T_1 \xrightarrow{K_{TT}} \{(T_n + S_0) \text{ or } (S_n + S_0)\},$$

where the reaction products are a ground state ($S_0$), and a triplet ($T_N$) or singlet ($S_f$) in the $n^{th}$ electronic manifold (n≦1). The creation of a singlet exciton in the latter reaction is responsible for delayed fluorescence. The triplet-triplet annihilation rate, $K_{TT}$, is related to the diffusion coefficient since the triplet mobility controls their encounter probability. That is:

$$K_{TT} = 4\pi D R_{\text{eff}} \qquad \text{(Eq. 3)}$$

where D is the non-dispersive diffusion coefficient, and $R_{\text{eff}}$ is the effective radius for quenching such that triplets approaching within this distance are assumed to annihilate with unity probability. Hertel, et al., Chem. Phys. 115, 10007-10013 (2001); Chandrasekhar, Review of Modern Physics 15, 1-84 (1943).

The results of several experiments are combined to study the one-dimensional evolution of the CBP triplet density, $T_H(x,t)$. Assuming non-dispersive transport, $T_H(x,t)$ obeys the following diffusion equation:

$$\frac{\partial T_H}{\partial t} = D\frac{\partial^2 T_H}{\partial x^2} - \frac{T_H}{\tau_T} - K_{TT} T_H^2. \qquad \text{(Eq. 4)}$$

Here, triplets are lost via natural decay in time, $\tau_T$, as well as via T-T annihilation at a rate, $K_{TT}$. The annihilation reaction can yield singlets that give rise to delayed fluorescence. In this case, the singlet density, $S_H(x,t)$, is:

$$\frac{\partial S_H}{\partial t} = -\frac{S_H}{\tau_S} + \frac{1}{2} K_{TT} T_H^2, \qquad \text{(Eq. 5)}$$

where the generation term (second on the right hand side) has a prefactor of ½ since annihilation of two triplets produces one singlet. We assume for simplicity that all T-T annihilation reactions yield singlets that decay naturally in time, $\tau_S$. There is no explicit spatial dependence in Eq. 5 since the effects of singlet diffusion are not relevant on the time scales of our experiments.

Similar equations are obtained for the case of a doped film. The dopant provides an additional decay route for host triplets—namely Dexter transfer to the guest dopant molecules at a rate, $K_{TG}$. Hence, in the presence of a guest:

$$\frac{\partial T_H}{\partial t} = D\frac{\partial^2 T_H}{\partial x^2} - K_{TT} T_H^2 - \left(K_{TG} + \frac{1}{\tau_T}\right) T_H. \qquad \text{(Eq. 6)}$$

For exothermic $T_H \to T_G$ transfer, back-transfer from guest to host is not energetically favorable, resulting in triplet localization on the dopant. In this case, the guest triplet density, $T_G(x,t)$, is:

$$\frac{\partial T_G}{\partial t} = -\frac{T_G}{\tau_G} + K_{TG} T_H. \qquad \text{(Eq. 7)}$$

Equations (4)-(7) provide the framework for the analysis of the experimental results.

The TOF transient data is analyzed by applying Eqs. (4) and (5) to region 1 of our samples (see FIG. 17), and Eqs. (6) and (7) to region 2. Equation (4) describes the CBP triplet density in the spacer layer, $T_H(x,t)$, while Eq. (6) quantifies it in the sensor layer. These two equations are coupled at the spacer/sensor layer interface, with both $T_H(x,t)$ and its spatial derivative taken to be continuous across the boundary. The non-linear partial differential equations (4) and (6) are solved using finite element methods. COMSOL_Multiphysics, (Burlington, 2005).

The solutions for the spacer layer singlet population, $S_H(x,t)$ (Eq. 5), and the sensing layer guest triplet population, $T_G(x,t)$ (Eq. 7), are determined once $T_H(x,t)$ is known. By spatially integrating $S_H(x,t)$ and $T_G(X,t)$ across their respective regions, we find the total luminescent populations $S_H'(t)$ and $T_G'(t)$. These functions are then least-squares fit with statistical weighting to the corresponding TOF luminescence transient data.

The data in FIGS. 18 and 19 were fit for a given sensing layer using Eq's. (4)-(7) by varying the parameters D, $K_{TT}$, $K_{TG}$, and $T_{H0}$, (the initial triplet density). For these fits, we use the measured CBP triplet lifetime, the CBP singlet lifetime of $\tau_T$=0.7 ns, (Kawamura, et al., Appl. Phys. Lett. 84, 2724-2726 (2004)) and the known triplet lifetimes of Ir(ppy)$_3$, τG=0.8 μs[11] and PQIr, $\tau_G$=2.0 μs. (Lamansky, et al., Inorg. Chem. 40, 1704-1711 (2001)).

Figure 4:
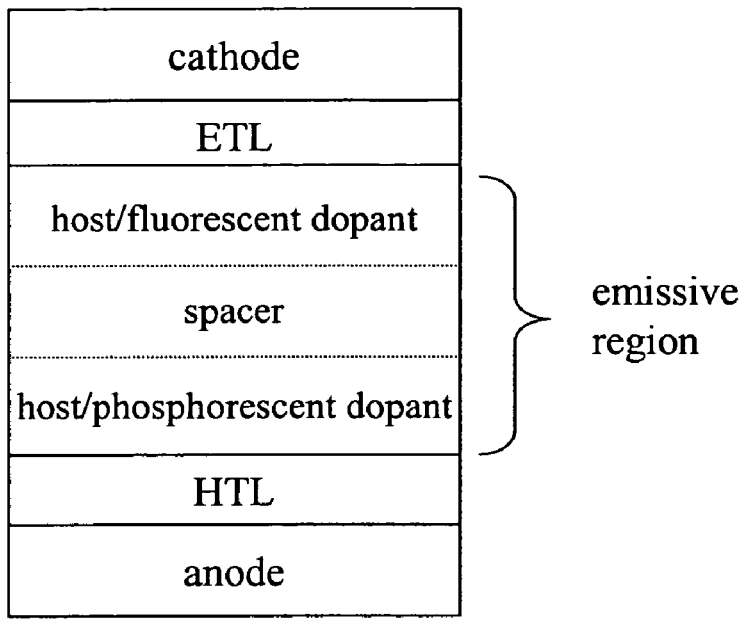
FIG. 4 show schematic device structures for embodiments of the invention.
Figure 4:
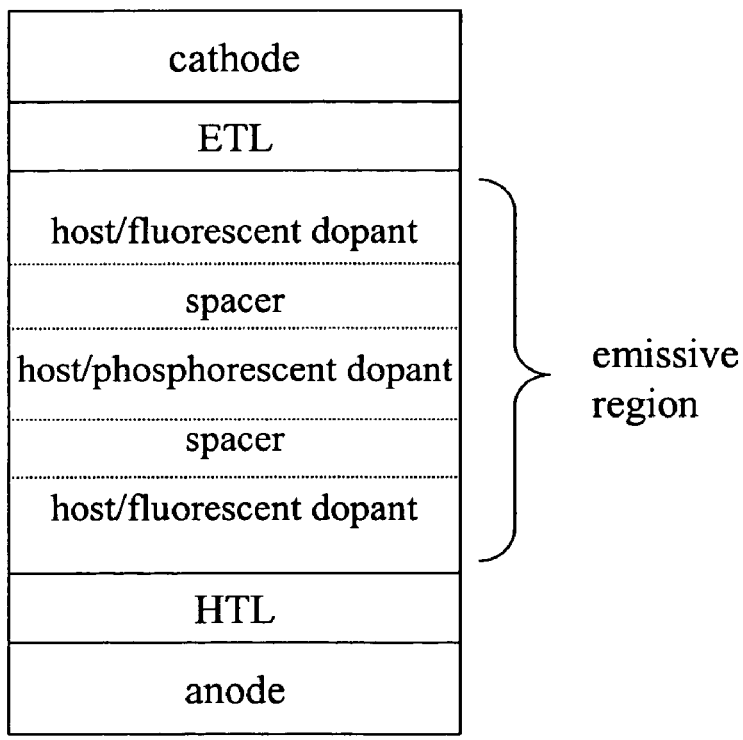
Figure 5:
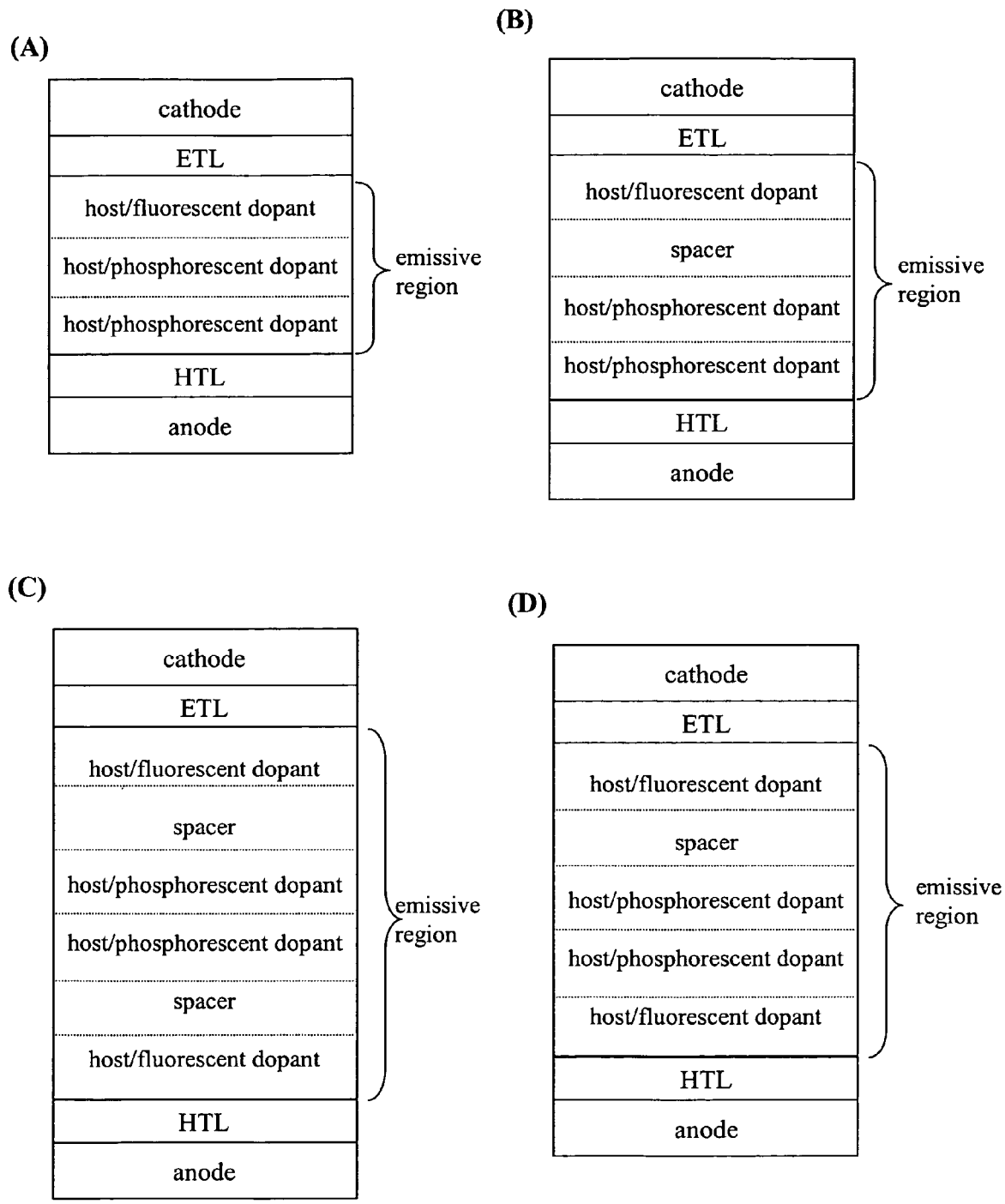
FIG. 5 show schematic device structures for embodiments of the invention.

The fitting results are summarized for both Ir(ppy)$_3$ and PQIr samples in Table 1, and are shown by the solid lines in FIGS. 4 and 5. Within experimental uncertainty, the same values for the parameters D, $K_{TT}$, and $T_{H0}$, are obtained for both sets of samples, as would be expected. However, $K_{TG}$ is nearly a factor of two greater for CBP→I(ppy)$_3$ transfer than for CBP→PQIr, presumably due to the stronger resonance between Ir(ppy)$_3$ and CBP triplet energies resulting in more efficient and rapid transfer.

TABLE 1

Fitting results: CBP triplet dynamics

| Parameter | CBP |
|---|---|
| D (cm$^2$/s) | $(1.4 \pm 0.3) \times 10^{-8}$ |
| K$_{TT}$ (cm$^3$/s) | $(1.6 \pm 0.4) \times 10^{-14}$ |
| T$_{H0}$ (cm$^{-3}$) | $(7 \pm 2) \times 10^{17}$ |
| τ$_H$ (ms) | $(14 \pm 8)$ |

| | CBP/Ir(ppy)$_3$ ($\Delta E_T$~−0.2 eV) | CBP/PQIr ($\Delta E_T$~−0.4 eV) |
|---|---|---|
| K$_{TG}$ (s$^{-1}$) | $(0.8 \pm 0.4) \times 10^7$ | $(0.5 \pm 0.2) \times 10^7$ |

Accounting for T-T annihilation at $T_{H0}=7\times10^{17}$ cm$^{-3}$, the effective diffusion length is $L_D\approx250$ Å, which is considerably less than $L_D=\sqrt{D\tau_H}\approx1400$ Å found in the absence of T-T annihilation. This is similar to the case of tris(8-hydroxyquinoline) (Alq$_3$), where $L_D>1400$ Å was found at low excitation, and reduced to 140 Å at high excitation. Baldo et al., Phys. Rev. B 62, 10958-10966 (2000). Note that the effective diffusion length of 250 Å calculated for these TOF results is consistent with the previous observation that significant changes in the transients only occur as the spacer is thinned to 300 Å. Similarly, the data of FIG. 20 was fit by fixing all parameters at the values given in Table 1, and allowing only $T_{H0}$ to vary. In Table 2, the fitted values for $T_{H0}$ are nearly proportional to the excitation intensity, as expected.

TABLE 2

Fitting results: Initial triplet density vs pulse energy

| Excitation Level (% of Full) | Initial Triplet Density $T_{H0} \times 10^{17}$ cm$^{-3}$ |
|---|---|
| 4.1 μJ (100%) | 9 ± 1 (100%) |
| 2.7 μJ (65%) | 6 ± 1 (66%) |
| 0.9 μJ (22%) | 2 ± 1 (22%) |

Figure 23:
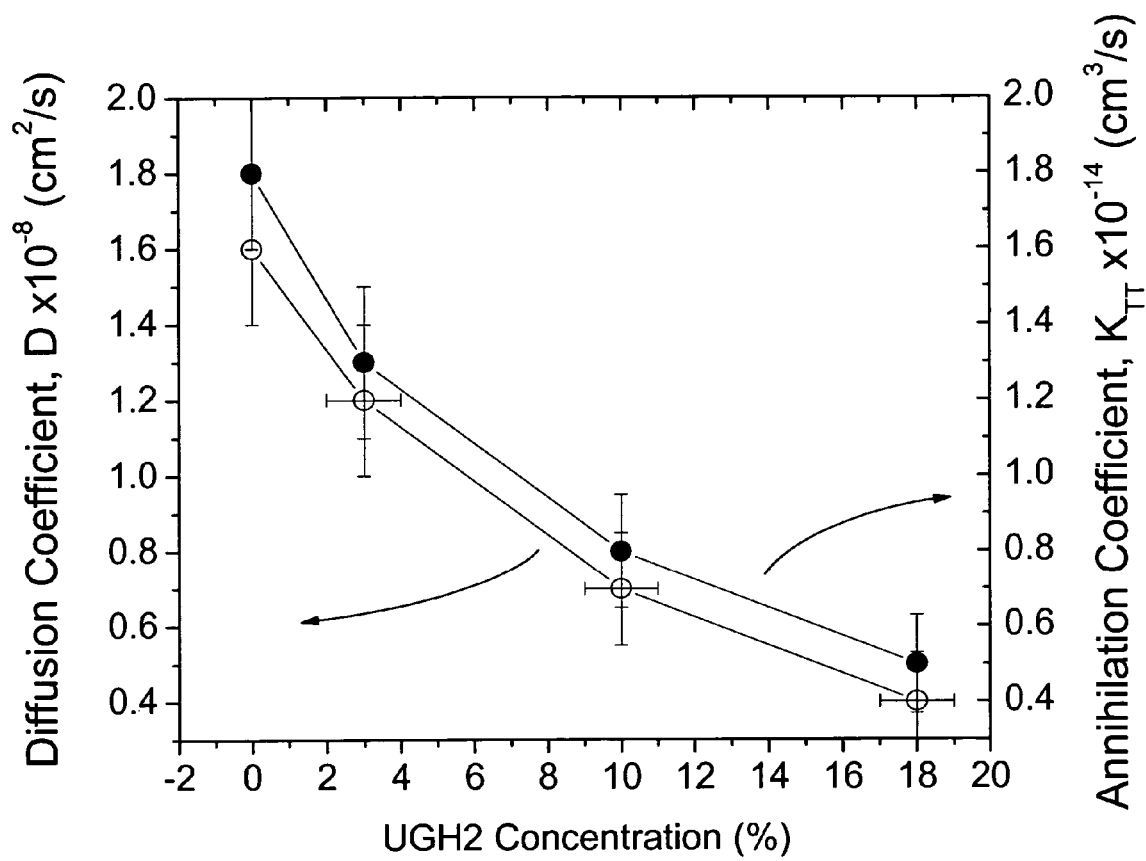
FIG. 23 shows Diffusion coefficient (D) and annihilation rate ($K_{TT}$) as a function of UGH2 concentration.

Fitting the transient data for the UGH2 doped samples of FIG. 21 confirms that the diffusion coefficient decreases with increasing UGH2 concentration. In this case, D and K$_{TT}$ are varied while holding all other parameters constant. Summarizing the fitting results in FIG. 23, we find that both D and K$_{TT}$ decrease at the same rate, consistent with Eq. (3). At an UGH2 concentration of 18 wt %, corresponding to less than two CBP molecules between each UGH2 molecule, the diffusion coefficient in the spacer layer drops by a factor of four. This effect is analogous to diffusion through porous media in that UHG2 molecules act as scattering centers for triplets diffusing in CBP. Abbasi, et al., AIChE J. 29, 617-624 (1983).

Example 8

A Device was prepared having the following structures:
ITO/NPD (400 Å)/CBP:BCzVBi (5%, 150 Å)/CBP (40 Å)/CBP:PQIfr (4%, 80 Å)/ CBP:Ir(ppy)$_3$ (5%, 120 Å)/CBP (60 Å)/CBP:BCzVBi (5%, 100 Å)/Bhen (200 Å)/Bhen:Li 1:1 (200 Å)/LiF/Al (500 Å).

Figure 24:
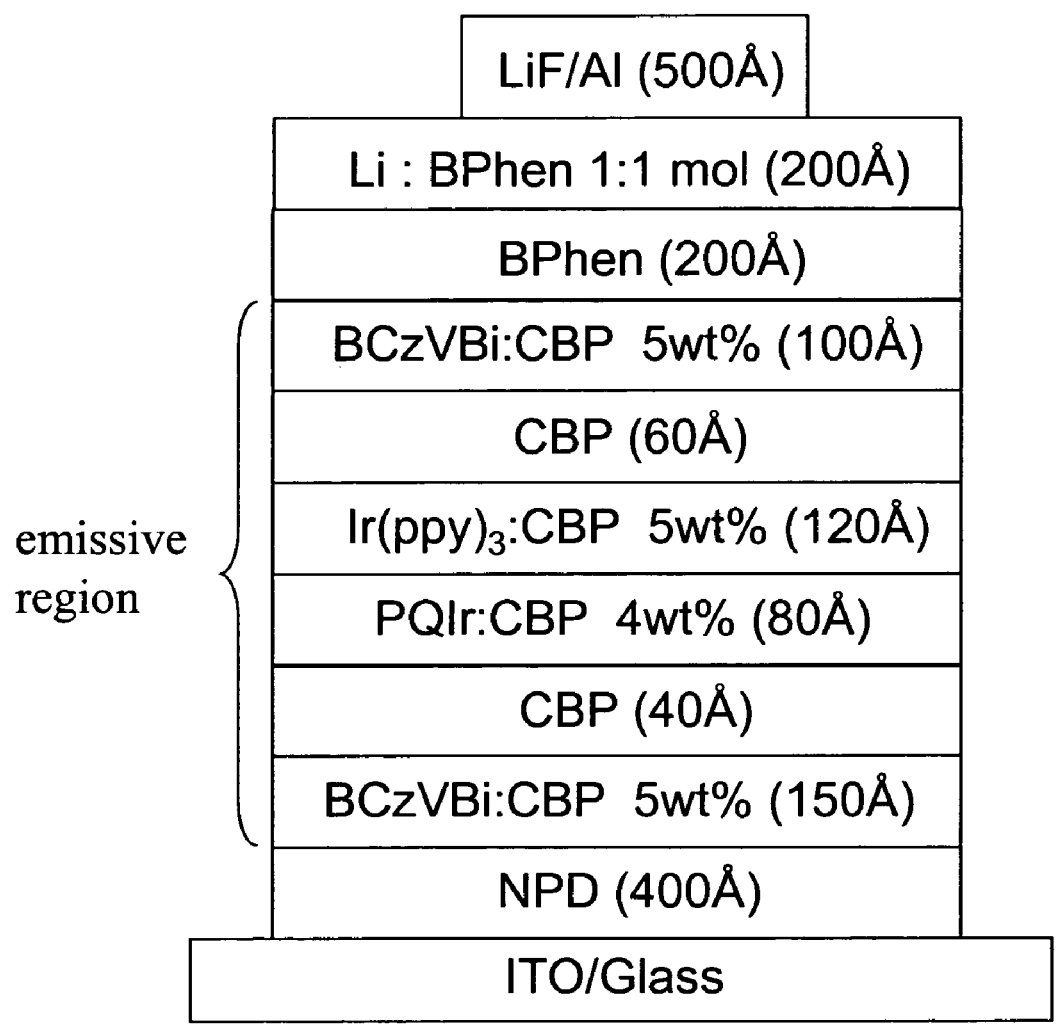
FIG. 24 shows the schematic device structure for the device of Example 8.
Figure 25:
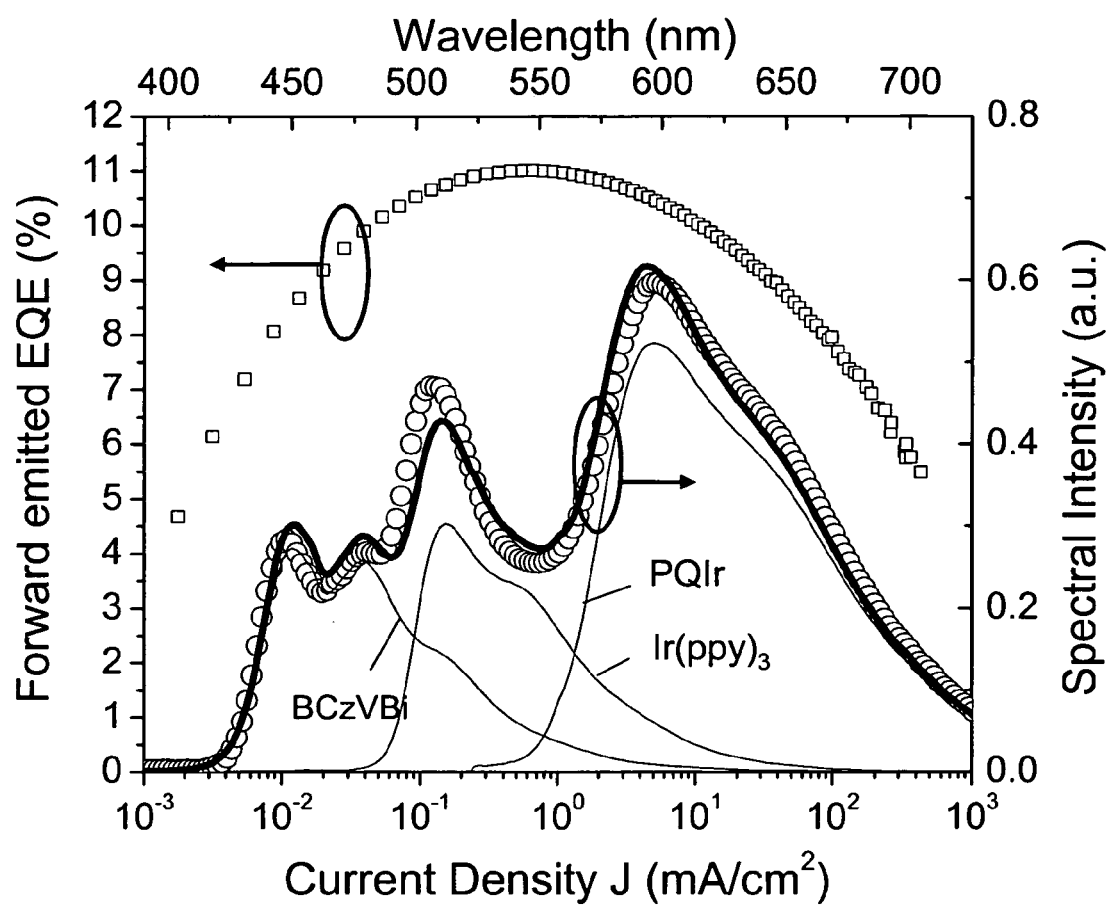
FIG. 25 shows the forward-emitted external quantum efficiency (open squares) as a function of current density (J), and the emission spectrum at J=10 mA/cm$^2$ (open circles) for the device of Example 8. This spectrum is fit (solid, bold line) using the individual dopant photoluminescent spectra (solid, thin lines).

The device structure is shown in FIG. 24 and emission properties are shown in FIG. 25.

Hole transport from the ITO anode to the emissive layer is facilitated by a 400 Å thick layer of NPD. A 200 Å thick layer of BPhen followed by 200 Å thick Li doped BPhen layer at a 1:1 molar ratio serves to transport electrons from the cathode while confining excitons within the emissive region. In the center of the emissive region is a 200 Å thick region consisting of Ir(ppy)$_3$ and PQIr doped into CBP. This phosphorescent region is sandwiched between two undoped CBP spacers (one 40 Å and the other 60 Å thick, see FIG. 24), which in turn are sandwiched between two layers of CBP (one 150 Å and the other 100 Å thick, see FIG. 24) doped with 5 wt % of the blue fluorescent emitter, BCzVBi. Roughly 75% of the resulting phosphorescent emission is due to triplet diffusion from the edges of the emissive region, followed by Dexter transfer to the dopants, with the remainder due to excitons formed by direct charge trapping on the phosphorescent emitters.

The operation of this device in steady-state is quantitatively analyzed using the values of D and K$_{TT}$ obtained in Example 7. Negligible diffusion of singlets away from their fluorescent zones at both edges of the emissive region is assumed due to their comparatively shorter diffusion lengths. All quenching processes are neglected except T-T annihilation since it is expected to be the dominant source of loss for the diffusing triplets. In addition, it is assumed that triplets do not transfer to the blue fluorescent dopant due to the poor guest-host orbital overlap that results from their different molecular conformations. Hosokawa, et al., Appl. Phys. Lett. 67, 3853-3855 (1995). Finally, the exciton distribution is assumed to exponentially decrease with distance from each edge of the emissive region (Kalinowski, et al., Appl. Phys. Lett. 72, 513-515 (1998)) with characteristic length, $d_{EX}$, (see FIG. 26b). In this structure, nearly every injected charge results in an exciton since the transport layers (NPD and BPhen) confine charge within the emissive layer, thereby providing balanced electron and hole injection. Adachi, et al., Ieee Journal Of Selected Topics In Quantum Electronics 8, 372-377 (2002).

The component of the external quantum efficiency due to blue emission from BCzVBi is directly proportional to the number of singlets present in the two fluorescent zones. Using the fluorescent quantum yield of BCzVBi ($\phi_{FL}$) and the optical out-coupling efficiency through the glass substrate (D'Andrade, et al., Adv. Mater. (Weinheim, Fed. Repub. Ger.) 16, 624-627 (2004); Gu, et al., Opt. Lett. 22, 396-398 (1997)) ($\phi_{OC}$=0.2), the singlet density, S, is estimated as a function of injection current density, J. By equating S to the integral of the singlet exciton formation profile (see FIG. 26) over the two distinct fluorescent zones, we can determine the total exciton density distribution, since three triplets are formed for every singlet. In addition, we allow for a fraction, $\alpha_T$, of the total exciton population to form by trapping directly on the phosphors. Using this profile, the rate equations for the singlet and triplet densities in the emissive layer are:

$$\frac{\partial T}{\partial t} = D_T\frac{\partial^2 T}{\partial x^2} - \frac{T}{\tau_T} - k_{TT}T^2 + \frac{3J(1-\alpha_T)}{qd_{EX}(1-\exp[-x_0/d_{EX}])}\left[\frac{\eta_{Blue}}{\phi_{FL}\phi_{OC}}\right] \times \left(\delta_{Left}\exp\left[\frac{-x}{d_{EX}}\right] + \delta_{Right}\exp\left[\frac{x-x_0}{d_{EX}}\right]\right) + \left[\frac{3J(\eta_{Blue})\alpha_T}{q\phi_{FL}\phi_{OC}W_{PH}} - TK_{TG}\right]_{PH}_{Rgn}, \text{ and}$$
(Eq. 8)

$$\frac{\partial S}{\partial t} = -\frac{S}{\tau_S} + \frac{J(1-\alpha_T)}{qd_{EX}(1-\exp[-x_0/d_{EX}])}\left[\frac{\eta_{Blue}}{\phi_{FL}\phi_{OC}}\right] \times \left(\delta_{Left}\exp\left[\frac{-x}{d_{EX}}\right] + \delta_{Right}\exp\left[\frac{x-x_0}{d_{EX}}\right]\right) + \frac{J(\eta_{Blue})\alpha_T}{q\phi_{FL}\phi_{OC}W_{PH}}.$$
(Eq. 9)

Here, $\delta_{Left/Right}$ are the weighting fractions for exciton formation at the left/right side of the emissive layer (see FIG. 26b), and $\tau_G$ and $\tau_s$ are the phosphor and BCzVBi lifetimes, respectively. We find that $\phi_{FL}$~0.6 for BCzVBi in toluene solution, using standard procedures. Morris, et al., J. Phys. Chem. 80, 969-974 (1976). Also, $\eta_{Blue}$ is the forward-emitted external quantum efficiency for an optimized, purely fluorescent device using a 5 wt % BCzVBi:CBP emissive layer, and ranges from 2.7% at J=1 mA/cm² to 2.3% at 100 mA/cm². Any deviation in the blue component of the F/P WOLED efficiency from $\eta_{Blue}$ is a result of the fraction, $\alpha_T$, of excitons formed by direct charge trapping on the phosphor molecules outside of the fluorescent zones, as described by the last term on the right hand side of Eqs. (8) and (9).

Figure 27:
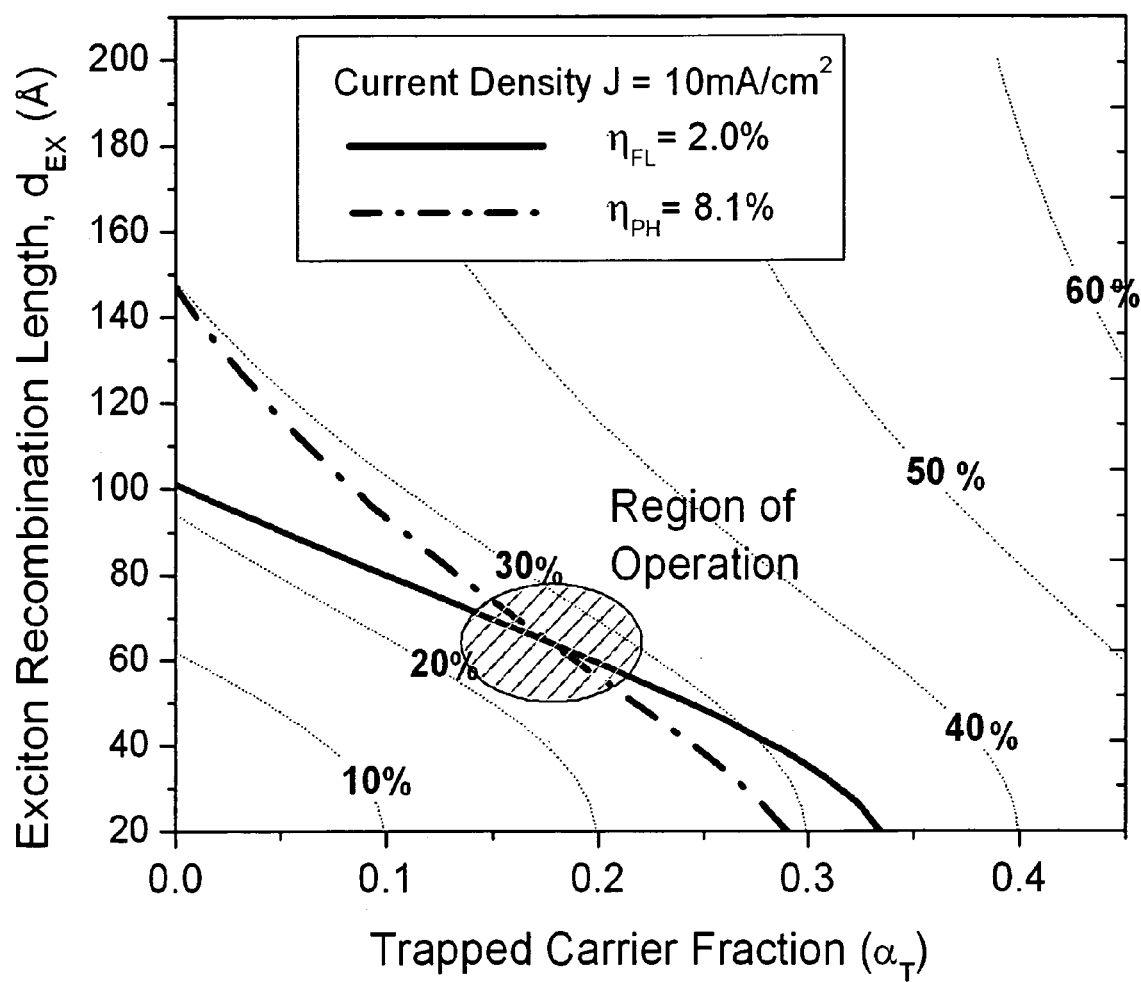
FIG. 27 shows model results for the fluorescent/phosphorescent WOLED calculated using Eqs. (6) to (9) in text. The dotted contours indicate the percentage of excitons that are formed by direct charge trapping on the phosphor dopants. Superimposed on this contour plane are lines of constant component dopant efficiency at a current density of J=10 mA/cm$^2$ for the fluorophore (solid line) and phosphor (dashed-dotted line) that are obtained by fits to the WOLED device data of Example 8.

Solving Eqs. (8) and (9) in steady-state for S(x) and T(x), we can express the fluorescent ($\eta_{FL}$) and phosphorescent ($\eta_{PH}$) components of the total WOLED efficiency as:

$$\frac{J}{q\phi_{OC}\phi_{FL}}(\eta_{FL}) = \frac{1}{\tau_S}\int_{\substack{Fluor\\Rgions}} S(x)dx, \text{ and} \qquad (Eq.\ 8)$$

$$\frac{J}{q\phi_{OC}}(\eta_{PH}) = \frac{1}{\tau_G}\int_{\substack{PH\\Rgion}} [T(x)+S(x)]dx, \qquad (Eq.\ 9)$$

where the phosphorescent quantum yield is taken to be unity. Kawamura, et al., Appl. Phys. Lett. 86, 071104 (2005). FIG. 27 summarizes the results, showing lines of constant component efficiency (solid=fluorescent; dashed-dotted=phosphorescent) at a current density of 10 MA/cm² for the device in FIG. 24, as determined from the weighted contributions of the dopant photoluminescent spectra to the device emission (see FIG. 25). These are overlaid on contours that indicate the percentage of total excitons formed by trapping on the phosphors (dotted line). Note that the total exciton fraction formed in the phosphor-doped region, indicated by the contours, is slightly greater than the trapping fraction, $\alpha_T$, since the exponential tails of the edge formation distributions also extend into the phosphor-doped region.

Although neither $d_{EX}$ nor $\alpha_T$ are known, the device operating point must correspond to the crossing of the fluorescent and phosphorescent efficiency lines. The crossings at all current densities (1 and 100 mA/cm₂, not shown) lie within the shaded region of FIG. 27, indicating a characteristic exciton formation length of $d_{Ex}$~75 Å, and a total exciton trapping fraction of 20-30%.

Figure 28:
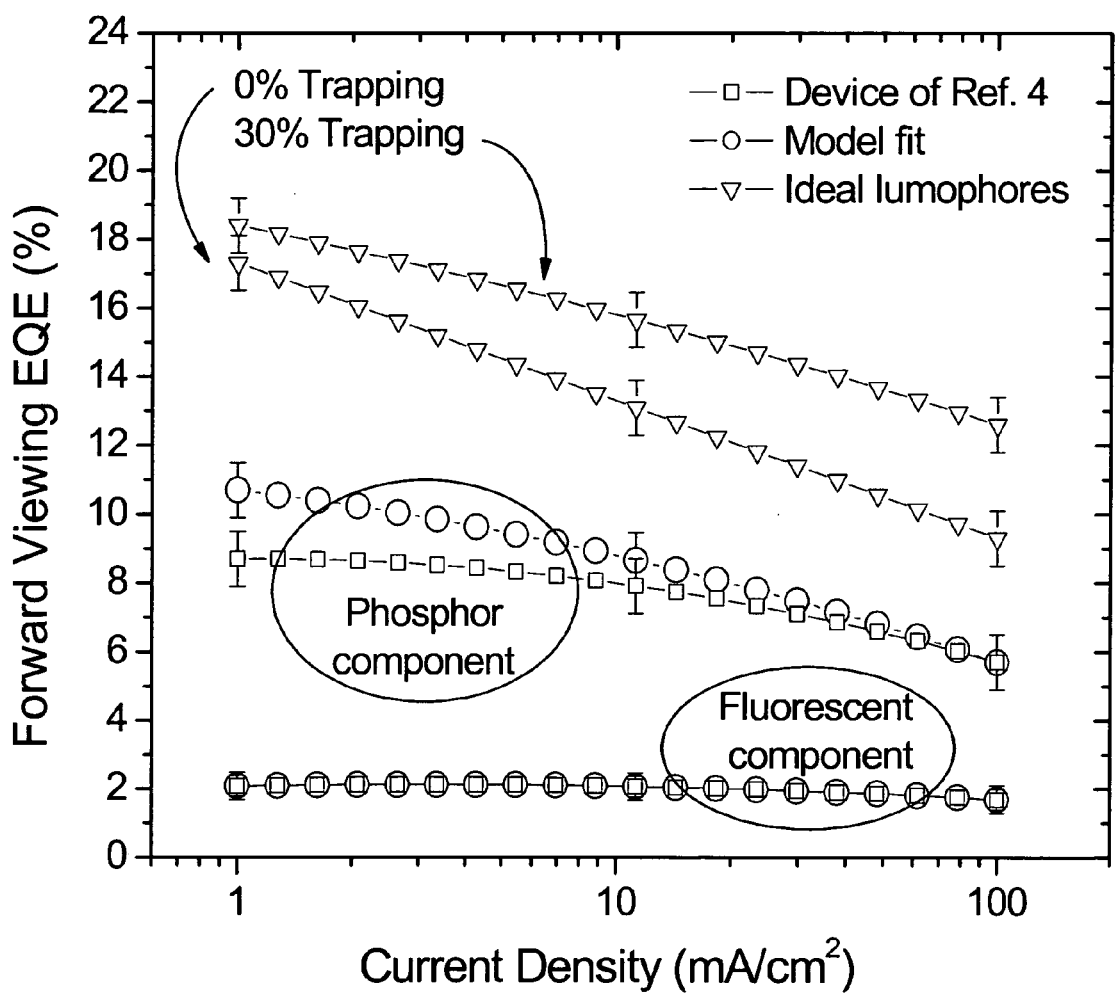
FIG. 28 shows the forward-emitted external quantum efficiency (EQE) vs. current density obtained from the device of Example 8 (squares) and the fit (circles) given by the model in the text. The separation of the device EQE data into individual fluorescent and phosphorescent contributions is obtained by weighting to the photoluminescent spectra of each lumophore in the fit to the WOLED emission spectrum as shown in FIG. 25, making sure to account for the intensity to quantum conversion. Inverted triangles indicate predictions for the structure in FIG. 25 using "ideal" emitters having unity quantum yield for the cases of 0 and 30% direct exciton formation on the phosphors.

In FIG. 28 shows the simulated external quantum efficiency at this operating point. For the fluorescent component, there is good agreement at all current densities with the device data, which has been reproduced for comparison. At low current densities, however, the model overestimates the phosphorescent emission component of the EQE. This discrepancy is attributed to losses, such as exciton-polaron and singlet-triplet quenching, not accounted for in the model. However, at higher current densities where T-T annihilation becomes the dominant source of loss, the model prediction falls close to the device data.

Balanced white emission with a high color rendering index (CRI) (*Method of measuring and specifying colour rendering properties of light sources*(Commission Internationale de L'éclairage (CIE), 1974) can be achieved with a smaller blue emissive component than the singlet spin fraction ($\chi_s=\frac{1}{4}$) affords. Charges that form excitons by trapping increase the phosphor emission at the expense of blue fluorescence, since they are prevented from otherwise forming BCzVBi singlets. Trap formation is thus beneficial to device performance since the trapped exciton fraction is not subject to diffusive transport losses, and the reduced triplet density at the edges of the emissive region decreases T-T quenching. From the photoluminescent spectrum of each dopant (see FIG. 25), we calculate that CRI>80 can be maintained for up to 35% exciton formation via direct trapping. Thus, this device operates close to the optimum point, representing a tradeoff between high efficiency and white color balance.

We can extend this model to predict the performance for this same structure using an "ideal" fluorescent dopant with unity luminescent quantum yield. As shown in FIG. 28, the maximum forward-emitted efficiency increases from 17% (CRI=86) in the absence of trapping to 18.5% (CRI=81) for an optimum trapping fraction of 30%. Accounting for all white light emitted (D'Andrade et al., Adv. Mater. 16, 1585-1595 (2004)), the total (integrated) external quantum efficiency for this optimized device is 31%. In addition, the roll-off in EQE with increasing current density is lessened (as compared to the device without trapping) since T-T annihilation is reduced, as discussed above.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device comprising:
   a cathode,
   an emissive region, and
   an anode
   wherein,
   the emissive region comprises a fluorescent layer comprising a fluorescent emitting material as a dopant in a host material, and a phosphorescent layer comprising a phosphorescent emitting material as a dopant in a host material;
   wherein the combined emission of the emitting materials gives a white emission from the device; and
   wherein greater than about 50% of the excitons are generated in the fluorescent layer.

2. The device of claim 1, wherein greater than about 70% of the excitons are generated in the fluorescent layer.

3. The device of claim 1, wherein the emissive region further comprises a spacer layer between the fluorescent layer and the phosphorescent layer.

4. The device of claim 3, wherein the host material for the fluorescent layer, the host material for the phosphorescent layer and the spacer layer are comprised of the same material.

5. The device of claim 4, wherein the host material for the fluorescent layer, the host material for the phosphorescent layer and the spacer layer are comprised of CBP.

6. The device of claim 1, wherein the fluorescent emitting material is a blue emitting fluorescent material.

7. The device of claim 6, wherein the fluorescent emitting material is BCzVBi.

8. The device of claim 1, wherein the emissive region has the structure fluorescent layer/spacer/phosphorescent layer.

9. The device of claim 1, wherein the emissive region has the structure fluorescent layer/spacer/phosphorescent layer/phosphorescent layer.

10. The device of claim 1 wherein the emissive region has the structure fluorescent layer/spacer/phosphorescent layer/fluorescent layer.

11. The device of claim 1, wherein the emissive region has the structure fluorescent layer/phosphorescent layer/spacer/fluorescent layer.

12. The device of claim 1, wherein the emissive region has the structure fluorescent layer/spacer/phosphorescent layer/spacer/fluorescent layer.

13. The device of claim 1, wherein the emissive region has the structure fluorescent layer/spacer/phosphorescent layer/phosphorescent layer/fluorescent layer.

14. The device of claim 1, wherein the emissive region has the structure fluorescent layer/phosphorescent layer/phosphorescent layer/spacer/fluorescent layer.

15. The device of claim 1, wherein the emissive region has the structure fluorescent layer/spacer/phosphorescent layer/phosphorescent layer/spacer/fluorescent layer.

16. The organic light emitting device of claim 6, wherein the device emits light having CIE coordinates of X=0.37±0.07, and Y=0.37±0.07.

17. The organic light emitting device of claim 6, wherein the device emits light having CIE coordinates of X=0.35 ±0.05, and Y=0.35 ±0.05.

18. The organic light emitting device of claim 6, wherein the device emits light having CIE coordinates of X=0.33 ±0.02, Y=0.33 ±0.02.

19. The organic light emitting device of claim 6, wherein the device emits light having a CRI of greater than about 75.

20. The organic light emitting device of claim 6, wherein the device emits light having a CRI of greater than about 80.

21. The organic light emitting device of claim 6, wherein the device emits light having a CRI of greater than about 85.

22. The organic light emitting device of claim 1, wherein exciton transfer from host to dopant for at least one of the emissive dopants is approximately resonant.

23. The organic light emitting device of claim 1, wherein charge is trapped on the fluorescent emitting material.

24. The organic light emitting device of claim 1, wherein charge is trapped on the phosphorescent emitting material.

25. An organic light emitting device comprising:
a cathode,
an emissive region comprising the following layers in sequence
a fluorescent layer comprising a fluorescent emitting material as a dopant in a host material,
a spacer layer,
a phosphorescent layer comprising a phosphorescent emitting material as a dopant in a host material,
a spacer layer, and
a fluorescent layer comprising a fluorescent emitting material as a dopant in a host material; and
an anode,
wherein the combined emission of the emitting materials gives a white emission from the device.

26. The device of claim 25, wherein greater than about 50% of the excitons are generated in the fluorescent layers.

27. The device of claim 26, wherein greater than about 70% of the excitons are generated in the fluorescent layers.

28. The device of claim 25, wherein the fluorescent material is a blue-emitting material.

29. The device of claim 25, wherein the fluorescent material is BCzVBi.

30. The device of claim 25, wherein the phosphorescent layer comprises a green phosphorescent emitting material and a red phosphorescent emitting material.

31. The device of claim 30, wherein the green phosphorescent emitting material is Irppy and a red phosphorescent emitting material PQIr.

32. The device of claim 30, wherein the green phosphorescent emitting material and a red phosphorescent emitting material are separated into separate sub-layers.

33. The device of claim 23, wherein the host material for the fluorescent layers, the host material for the phosphorescent layer and the spacer layers are comprised of the same material.

34. The device of claim 25, wherein the host material for the fluorescent layers, the host material for the phosphorescent layer and the spacer layers are comprised of CBP.

35. The device of claim 28, wherein the device emits light having CIE coordinates of X=0.37 ±0.07, and Y=0.37 ±0.07.

36. The device of claim 28, wherein the device emits light having CIE coordinates of X=0.35 ±0.05, and Y=0.35 ±0.05.

37. The device of claim 28, wherein the device emits light having CIE coordinates of X=0.33 ±0.02, Y=0.33 ±0.02.

38. The device of claim 28, wherein the device emits light having a CRI of greater than about 75.

39. The device of claim 28, wherein the device emits light having a CRI of greater than about 80.

40. The device of claim 28, wherein the device emits light having a CRI of greater than about 85.

41. The device of claim 25, wherein exciton transfer from host to dopant for at least one of the emissive dopants is approximately resonant.

42. The organic light emitting device of claim 25, wherein charge is trapped on the fluorescent emitting material.

43. The organic light emitting device of claim 25, wherein charge is trapped on the phosphorescent emitting material.

44. A method for the fabrication of an emissive region of an organic light emitting device, comprising the steps of:
depositing a fluorescent layer comprising a fluorescent emitting material as a dopant in a host material, wherein the fluorescent emitting material traps charge carriers such that subsequent singlet excitons form on the fluorescent emitting material to give an emission from the fluorescent layer; and
depositing a phosphorescent layer comprising a phosphorescent emitting material as a dopant in a host material, wherein the phosphorescent emitting material traps charge carriers such subsequent that triplet excitons form the phosphorescent emitting material to give an emission from the phosphorescent layer, 45. The method of claim 44, wherein 23% to 33% of the excitons formed when a voltage is applied across the device are formed by direct trapping on the phosphorescent dopant.

46. A method for the color tuning of an organic light emitting device, wherein the device comprises a cathode, an emissive region, and an anode, and wherein the emissive region comprises a fluorescent layer comprising a fluorescent emitting material as a dopant in a host material, and a phosphorescent layer comprising a phosphorescent emitting material as a dopant in a host material,
the method comprising the steps of:
providing the fluorescent emitting material in a concentration that traps a fraction of charge carriers such that a fraction of excitons formed in the device are singlet excitons formed by direct trapping on the fluorescent emitting material; and
providing the phosphorescent emitting material in a concentration that traps a fraction of charge carriers such that a fraction of excitons formed in the device are triplet excitons formed by direct trapping on the phosphorescent emitting material;

wherein the concentration of the fluorescent and phosphorescent emitting materials are provided to give a desired color emission when a voltage is applied across the device.

47. The method of claim 46, wherein 23% to 33% of the excitons formed when a voltage is applied across the device are formed by direct trapping on the phosphorescent dopant.

48. A method of claim 46, wherein the emission has CIE coordinates of X=0.37 ±0.07, and Y=0.37 ±0.07.

49. A method of claim 46, wherein the emission has CIE coordinates of X=0.35 ±0.05, and Y=0.35 ±0.05.

50. A method of claim 46, wherein the emission has CIE coordinates of X=0.33 ±0.02, Y=0.33 ±0.02.

51. A method of claim 46 wherein the emission has a CRI of greater than about 75.

52. A method of claim 46, wherein the emission has a CRI of greater than about 80.

53. A method of claim 46, wherein the emission has a CRI of greater than about 85.

* * * * *